US012740253B2

(12) United States Patent
Shin et al.

(10) Patent No.: US 12,740,253 B2
(45) Date of Patent: Sep. 15, 2026

(54) DISPLAY INCLUDING A PLURALITY OF OPAQUE MEMBERS STACKED ABOVE A PLURALITY OF SUB-PIXELS

(71) Applicant: Samsung Electronics Co., Ltd., Suwon-si (KR)

(72) Inventors: Sungyoung Shin, Suwon-si (KR); Minsuk Uhm, Suwon-si (KR); Haechang Lee, Suwon-si (KR); Keehyon Park, Suwon-si (KR); Kwangtai Kim, Suwon-si (KR); Donghyun Yeom, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 19/377,661

(22) Filed: Nov. 3, 2025

(65) Prior Publication Data

US 2026/0059951 A1 Feb. 26, 2026

Related U.S. Application Data

(63) Continuation of application No. PCT/KR2024/004849, filed on Apr. 11, 2024.

(30) Foreign Application Priority Data

| | | |
|---|---|---|
| May 26, 2023 | (KR) | 10-2023-0068226 |
| Jul. 4, 2023 | (KR) | 10-2023-0086453 |
| Jul. 18, 2023 | (KR) | 10-2023-0093443 |

(51) Int. Cl.

*H10K 59/122* (2023.01)
*G09G 3/3225* (2016.01)
(Continued)

(52) U.S. Cl.

CPC ......... *H10K 59/122* (2023.02); *G09G 3/3225* (2013.01); *H10K 50/844* (2023.02);
(Continued)

(58) Field of Classification Search

CPC .. H10K 59/122; H10K 59/353; H10K 59/873; H10K 59/40; H10K 59/38;
(Continued)

(56) References Cited

U.S. PATENT DOCUMENTS

| | | | |
|---|---|---|---|
| 12,048,217 | B2 | 7/2024 | Hong et al. |
| 12,156,456 | B2 | 11/2024 | Shin et al. |

(Continued)

FOREIGN PATENT DOCUMENTS

| | | |
|---|---|---|
| CN | 114914270 A | 8/2022 |
| KR | 10-1330494 B1 | 11/2013 |

(Continued)

OTHER PUBLICATIONS

International Search Report dated Aug. 2, 2024, issued in International Application No. PCT/KR2024/004849.

(Continued)

*Primary Examiner* — Alonzo Chambliss

(74) *Attorney, Agent, or Firm* — Jefferson IP Law, LLP

(57) ABSTRACT

An electronic device comprising a display is provided. The display includes a first sub-pixel visible at a first viewing angle, a second sub-pixel visible at a second viewing angle wider than the first viewing angle, first pixel definition portions defining a first light emission portion of the first sub-pixel, second pixel definition portions defining a second light emission portion of the second sub-pixel, first opaque portions disposed above the first pixel definition portions, and second opaque portions disposed between the first pixel definition portions and the first opaque portions, wherein a first width between the first opaque portions through which (Continued)

light emitted from the first sub-pixel passes is narrower than a second width between the second opaque portions.

14 Claims, 16 Drawing Sheets

(51) Int. Cl.
*H10K 50/844* (2023.01)
*H10K 59/35* (2023.01)
*H10K 59/38* (2023.01)
*H10K 59/40* (2023.01)
*H10K 59/80* (2023.01)

(52) U.S. Cl.
CPC ........... *H10K 59/353* (2023.02); *H10K 59/38* (2023.02); *H10K 59/40* (2023.02); *H10K 59/873* (2023.02); *H10K 59/875* (2023.02); *G09G 2320/068* (2013.01)

(58) Field of Classification Search
CPC ............. H10K 59/875; H10K 59/8792; H10K 50/844; C09G 3/3225; C09G 2320/068
See application file for complete search history.

(56) References Cited

U.S. PATENT DOCUMENTS

| | | | | |
|---|---|---|---|---|
| 2015/0064818 | A1* | 3/2015 | Li | H10K 59/35 438/46 |
| 2022/0301478 | A1 | 9/2022 | Jeong et al. | |
| 2023/0100284 | A1 | 3/2023 | Yao et al. | |
| 2023/0209883 | A1 | 6/2023 | Ji et al. | |
| 2024/0196690 | A1 | 6/2024 | Wu et al. | |
| 2024/0206297 | A1 | 6/2024 | Lee et al. | |
| 2024/0260432 | A1* | 8/2024 | Shin | H10K 59/38 |

FOREIGN PATENT DOCUMENTS

| | | | | |
|---|---|---|---|---|
| KR | 10-2334953 | B1 | 12/2021 | |
| KR | 10-2022-0008699 | A | 1/2022 | |
| KR | 10-2022-0043779 | A | 4/2022 | |
| KR | 10-2022-0069366 | A | 5/2022 | |
| KR | 10-2022-0085101 | A | 6/2022 | |
| KR | 10-2022-0130290 | A | 9/2022 | |
| KR | 10-2023-0035992 | A | 3/2023 | |
| KR | 10-2023-0052777 | A | 4/2023 | |
| WO | WO-2023017999 | A1 * | 2/2023 | G06F 3/04164 |

OTHER PUBLICATIONS

Korean Office Action dated Jun. 22, 2026, issued in Korean Application No. 10-2023-0093443.
European Search Report dated Jul. 22, 2026, issued in European Application No. 24815696.0.

* cited by examiner

DISPLAY INCLUDING A PLURALITY OF OPAQUE MEMBERS STACKED ABOVE A PLURALITY OF SUB-PIXELS

CROSS-REFERENCE TO RELATED APPLICATION(S)

This application is a continuation application, claiming priority under 35 U.S.C. § 365(c), of an International application No. PCT/KR2024/004849, filed on Apr. 11, 2024, which is based on and claims the benefit of a Korean patent application number 10-2023-0068226 filed on May 26, 2023, in the Korean Intellectual Property Office, of a Korean patent application number 10-2023-0086453, filed on Jul. 4, 2023, in the Korean Intellectual Property Office, and of a Korean patent application number 10-2023-0093443, filed on Jul. 18, 2023, in the Korean Intellectual Property Office, the disclosure of each of which is incorporated by reference herein in its entirety.

BACKGROUND

1. Field

The disclosure relates to a display including a structure for providing a different state for displaying a screen and an electronic device including the same.

2. Description of Related Art

An electronic device may provide visual information to a user through a display. The display of the electronic device may be configured to change a display state of the display based on identifying a request or an event of the user. For example, the electronic device may change the display state of the display to provide a screen based on identifying the request or the event of the user.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide a display including a structure for providing a different state for displaying a screen and an electronic device including the same.

Additional aspects will be set forth in part in the description which follows and, in part, will be apparent from the description, or may be learned by practice of the presented embodiments.

In accordance with an aspect of the disclosure, an electronic device including a display is provided. The display includes a first sub-pixel visible at a first viewing angle, a second sub-pixel visible at a second viewing angle wider than the first viewing angle, a first pixel definition portions defining a first light emission portion of the first sub-pixel, second pixel definition portions defining a second light emission portion of the second sub-pixel, first opaque portions disposed above the first pixel definition portions, and second opaque portions disposed between the first pixel definition portions and the first opaque portions, wherein a first width between the first opaque portions through which light emitted from the first sub-pixel passes is narrower than a second width between the second opaque portions.

In accordance with another aspect of the disclosure, a display device is provided. The display device includes a first sub-pixel visible at a first viewing angle, a second sub-pixel visible at a second viewing angle wider than the first viewing angle, first pixel definition portions defining a first light emission portion of the first sub-pixel, second pixel definition portions defining a second light emission portion of the second sub-pixel, first opaque portions disposed above the first pixel definition portions, and second opaque portions disposed between the first pixel definition portions and the first opaque portions, wherein a first width between the first opaque portions through which light emitted from the first sub-pixel passes is substantially equal to or narrower than a second width between the second opaque portions.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

It should be appreciated that the blocks in each flowchart and combinations of the flowcharts may be performed by one or more computer programs which include instructions. The entirety of the one or more computer programs may be stored in a single memory device or the one or more computer programs may be divided with different portions stored in different multiple memory devices.

Any of the functions or operations described herein can be processed by one processor or a combination of processors. The one processor or the combination of processors is circuitry performing processing and includes circuitry like an application processor (AP, e.g. a central processing unit (CPU)), a communication processor (CP, e.g., a modem), a graphics processing unit (GPU), a neural processing unit (NPU) (e.g., an artificial intelligence (AI) chip), a wireless fidelity (Wi-Fi) chip, a Bluetooth® chip, a global positioning system (GPS) chip, a near field communication (NFC) chip, connectivity chips, a sensor controller, a touch controller, a finger-print sensor controller, a display driver integrated circuit (IC), an audio CODEC chip, a universal serial bus (USB) controller, a camera controller, an image processing IC, a microprocessor unit (MPU), a system on chip (SoC), an IC, or the like.

Figure 1:
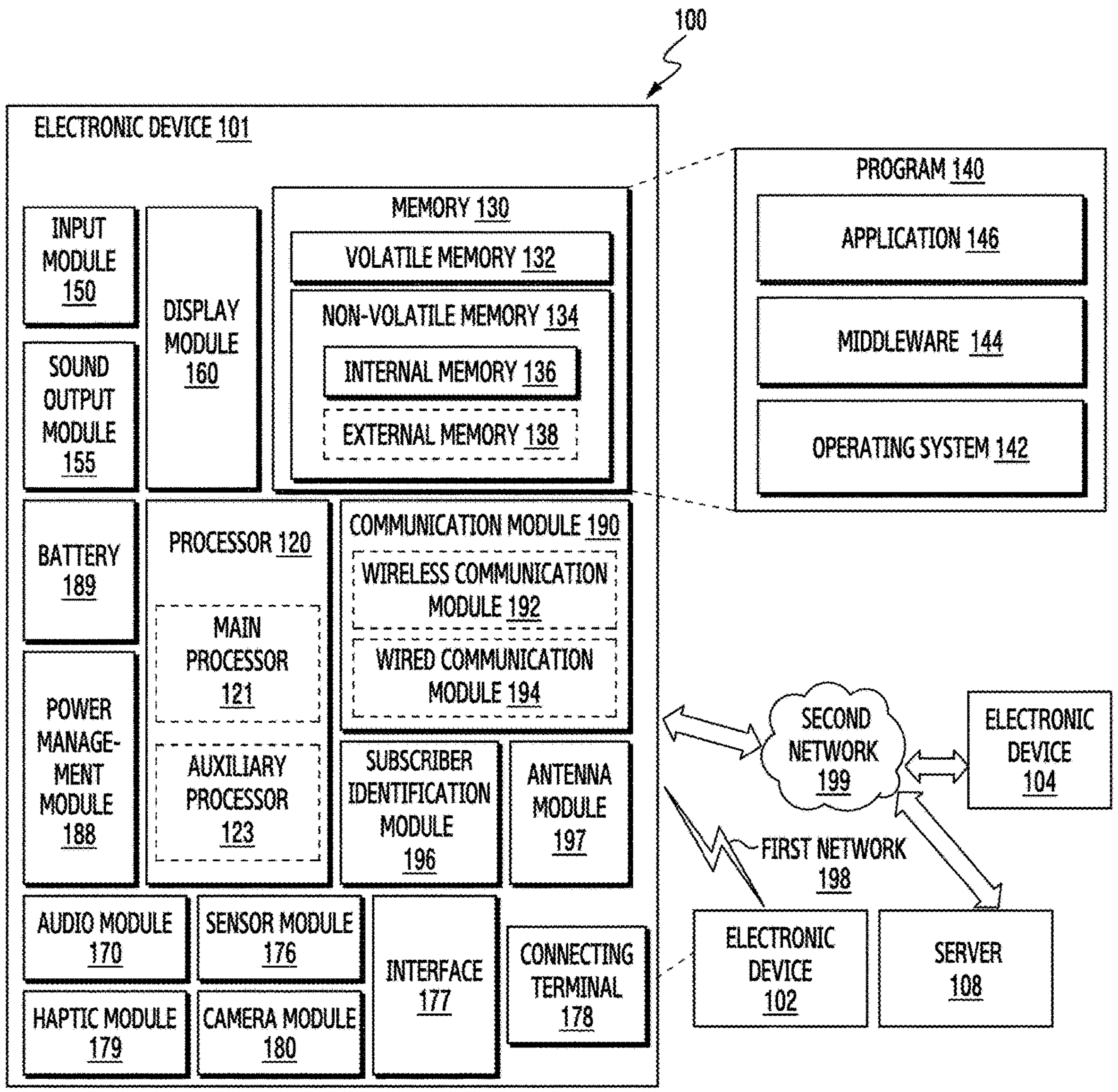
FIG. 1 is a block diagram of an electronic device in a network environment according to an embodiment of the disclosure.

FIG. 1 is a block diagram illustrating an electronic device in a network environment according to an embodiment of the disclosure.

Referring to FIG. 1, an electronic device 101 in a network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a fifth generation (5G) network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a fourth generation (4G) network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the millimeter-wave (mm Wave) band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or user plane (U-plane) latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mm Wave antenna module. According to an embodiment, the mm Wave antenna module may include a printed circuit board, an RFIC disposed on a first surface (e.g., the bottom surface) of the printed circuit board, or adjacent to the first surface and capable of supporting a designated high-frequency band (e.g., the mm Wave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102 or 104 or server 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2:
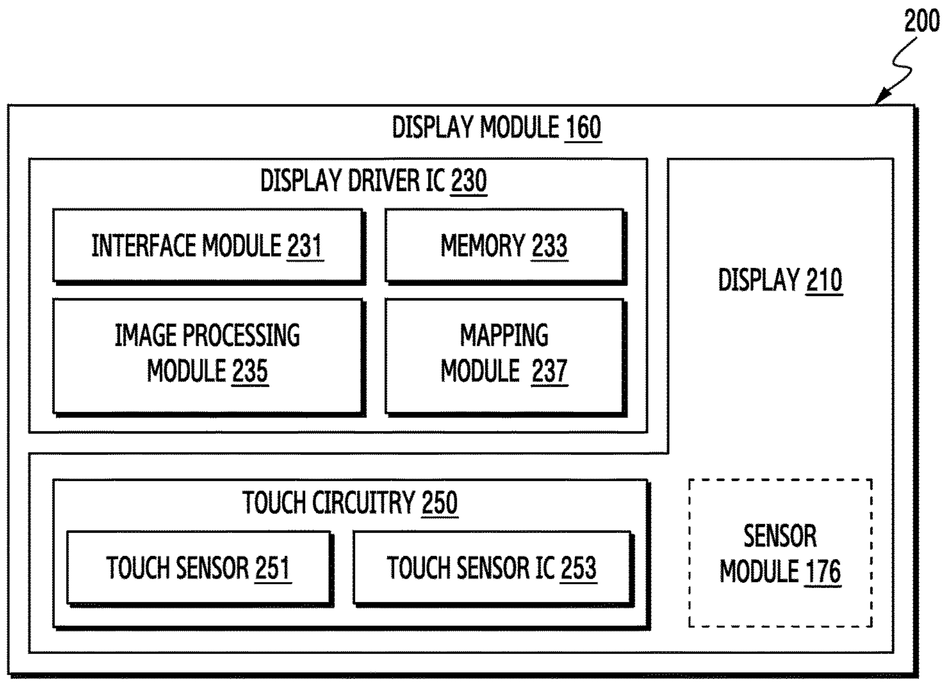
FIG. 2 is a block diagram of a display module according to an embodiment of the disclosure.

FIG. 2 is a block diagram illustrating the display module according to an embodiment of the disclosure.

Referring to FIG. 2, a block diagram illustrates a display module 160 that may include a display 210 and a display driver integrated circuit (DDI) 230 to control the display 210. The DDI 230 may include an interface module 231, memory 233 (e.g., buffer memory), an image processing module 235, or a mapping module 237. The DDI 230 may receive image information that contains image data or an image control signal corresponding to a command to control the image data from another component of the electronic device 101 via the interface module 231. For example, according to an embodiment, the image information may be received from the processor 120 (e.g., the main processor 121 (e.g., an application processor)) or the auxiliary processor 123 (e.g., a graphics processing unit) operated independently from the function of the main processor 121. The DDI 230 may communicate, for example, with touch circuitry 250 or the sensor module 176 via the interface module 231. The DDI 230 may also store at least part of the received image information in the memory 233, for example, on a frame by frame basis. The image processing module 235 may perform pre-processing or post-processing (e.g., adjustment of resolution, brightness, or size) with respect to at least part of the image data. According to an embodiment, the pre-processing or post-processing may be performed, for example, based at least in part on one or more characteristics of the image data or one or more characteristics of the display 210. The mapping module 237 may generate a voltage value or a current value corresponding to the image data pre-processed or post-processed by the image processing module 235. According to an embodiment, the generating of the voltage value or current value may be performed, for example, based at least in part on one or more attributes of the pixels (e.g., an array, such as a red, green, and blue (RGB) stripe or a pentile structure, of the pixels, or the size of each subpixel). At least some pixels of the display 210 may be driven, for example, based at least in part on the voltage value or the current value such that visual information (e.g., a text, an image, or an icon) corresponding to the image data may be displayed via the display 210.

According to an embodiment, the display module 160 may further include the touch circuitry 250. The touch circuitry 250 may include a touch sensor 251 and a touch sensor IC 253 to control the touch sensor 251. The touch sensor IC 253 may control the touch sensor 251 to sense a touch input or a hovering input with respect to a certain position on the display 210. To achieve this, for example, the touch sensor 251 may detect (e.g., measure) a change in a signal (e.g., a voltage, a quantity of light, a resistance, or a quantity of one or more electric charges) corresponding to the certain position on the display 210. The touch circuitry 250 may provide input information (e.g., a position, an area, a pressure, or a time) indicative of the touch input or the hovering input detected via the touch sensor 251 to the processor 120. According to an embodiment, at least part (e.g., the touch sensor IC 253) of the touch circuitry 250 may be formed as part of the display 210 or the DDI 230, or as part of another component (e.g., the auxiliary processor 123) disposed outside the display module 160.

According to an embodiment, the display module 160 may further include at least one sensor (e.g., a fingerprint sensor, an iris sensor, a pressure sensor, or an illuminance sensor) of the sensor module 176 or a control circuit for the at least one sensor. In such a case, the at least one sensor or the control circuit for the at least one sensor may be embedded in one portion of a component (e.g., the display 210, the DDI 230, or the touch circuitry 250)) of the display module 160. For example, when the sensor module 176 embedded in the display module 160 includes a biometric sensor (e.g., a fingerprint sensor), the biometric sensor may obtain biometric information (e.g., a fingerprint image) corresponding to a touch input received via a portion of the display 210. As another example, when the sensor module 176 embedded in the display module 160 includes a pressure sensor, the pressure sensor may obtain pressure information corresponding to a touch input received via a partial or whole area of the display 210. According to an embodiment, the touch sensor 251 or the sensor module 176 may be disposed between pixels in a pixel layer of the display 210, or over or under the pixel layer.

Figure 3:
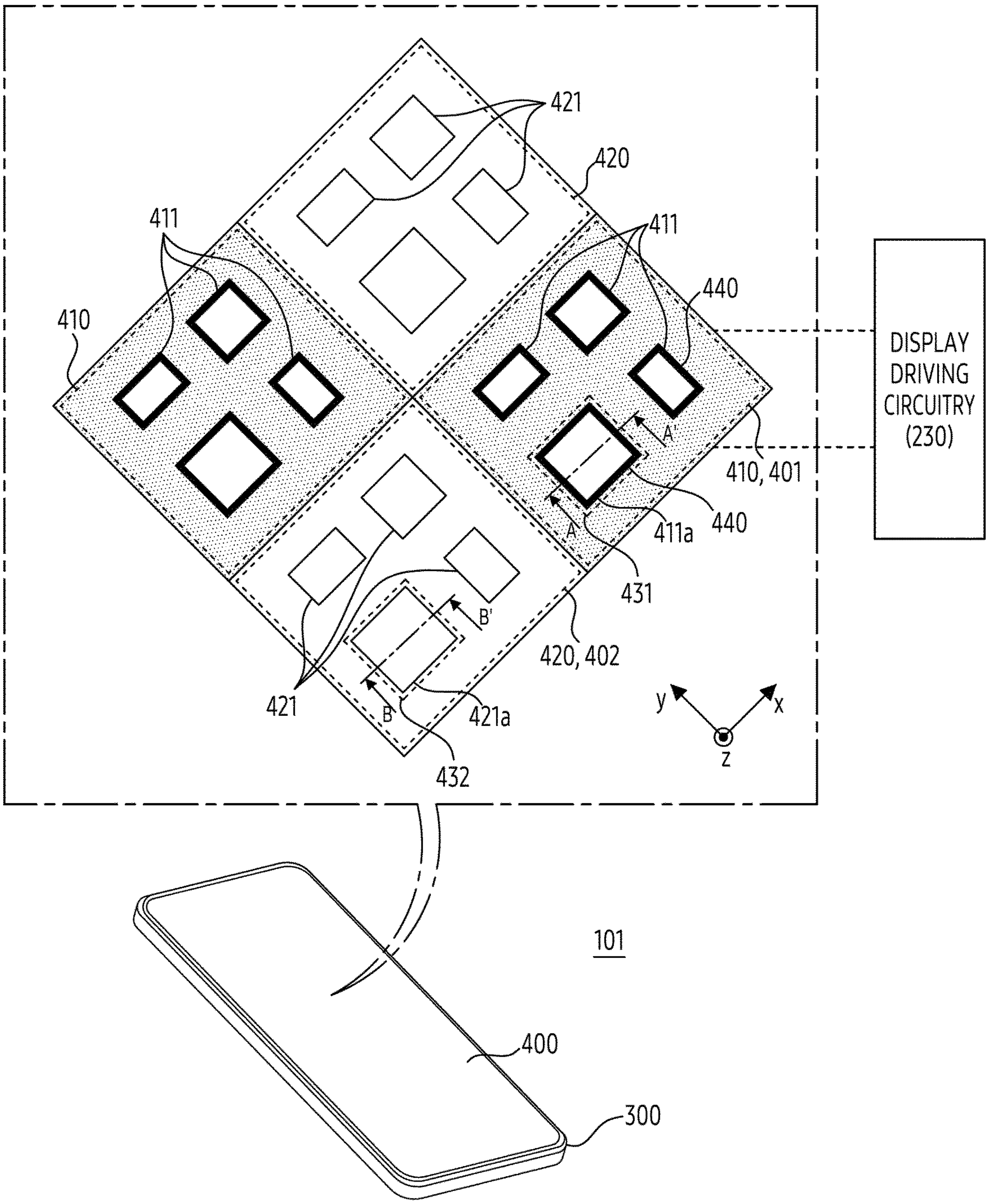
FIG. 3 illustrates an electronic device according to an embodiment of the disclosure.

FIG. 3 illustrates an electronic device according to an embodiment of the disclosure.

Referring to FIG. 3, an electronic device 101 according to an embodiment may include display driving circuitry 230, a housing 300, and/or a display 400 (e.g., the display 210 of FIG. 2).

According to an embodiment, the housing 300 may define (or form) at least a portion of an outer surface of the electronic device 101. The housing 300 may accommodate various components of the electronic device 101. For example, the housing 300 may include an internal space in which the various components of the electronic device 101 may be accommodated. The housing 300 may support the various components of the electronic device 101. For example, the housing 300 may support the display 400. For example, the display 400 may be disposed on the housing 300. For example, the display 400 may be coupled to the housing 300.

According to an embodiment, the display 400 may be configured to provide visual information. The display 400 may be configured to emit light for providing visual content (or content). The display 400 may include a plurality of first pixels 410 and a plurality of second pixels 420. The display 400 may be configured to emit light through the plurality of first pixels 410 and/or the plurality of second pixels 420. Each of the plurality of first pixels 410 may include a plurality of first sub-pixels 411. For example, the plurality of first sub-pixels 411 may define (or form) each of the plurality of first pixels 410. For example, the plurality of first sub-pixels 411 may include a first set of sub-pixels that define (or form) one first pixel of the plurality of first pixels 410. For example, the first set of sub-pixels may include one sub-pixel for emitting red light, two sub-pixels for emitting green light, and/or one sub-pixel for emitting blue light, but is not limited thereto. For example, the first set of sub-pixels may also include one sub-pixel for emitting red light, one sub-pixel for emitting green light, and/or one sub-pixel for emitting blue light. For example, the first set of sub-pixels may also include one sub-pixel for emitting red light, one sub-pixel for emitting green light, one sub-pixel for emitting blue light, and/or one sub-pixel for emitting white light. According to an embodiment, the plurality of first sub-pixels 411 may be disposed in a first portion 401 of the display 400. For example, a first sub-pixel 411*a* included in the plurality of first sub-pixels 411 may be disposed in the first portion 401.

According to an embodiment, each of the plurality of second pixels 420 may include a plurality of second sub-pixels 421. For example, the plurality of second sub-pixels 421 may define (or form) each of the plurality of second pixels 420. For example, the plurality of second sub-pixels 421 may include a second set of sub-pixels that define one second pixel of the plurality of second pixels 420. For example, the second set of sub-pixels may include one sub-pixel for emitting red light, two sub-pixels for emitting green light, and/or one sub-pixel for emitting blue light, but is not limited thereto. For example, the second set of sub-pixels may also include one sub-pixel for emitting red light, one sub-pixel for emitting green light, and/or one sub-pixel for emitting blue light. According to an embodiment, the plurality of second sub-pixels 421 may be disposed in a second portion 402 of the display 400. For example, a second sub-pixel 421*a* included in the plurality of second sub-pixels 421 may be disposed in the second portion 402. For example, the second portion 402 may be connected to the first portion 401, but is not limited thereto. For example, the second portion 402 may also be spaced apart from the first portion 401. For example, the display 400 may include a plurality of first portions and a plurality of second portions alternately disposed.

According to an embodiment, a viewing angle of the plurality of second pixels 420 may be different from a viewing angle of the plurality of first pixels 410. For example, the viewing angle of the plurality of second pixels 420 may be wider than the viewing angle of the plurality of first pixels 410. A viewing angle of each of the plurality of second sub-pixels 421 in the plurality of second pixels 420 may be wider than a viewing angle of each of the plurality of first sub-pixels 411 in the plurality of first pixels 410. For example, the first sub-pixel 411*a* of the plurality of first sub-pixels 411 may have a first viewing angle, and the second sub-pixel 421*a* of the plurality of second sub-pixels 421 may have a second viewing angle wider than the first viewing angle. According to an embodiment, a size of a first light-emitting region 431 in the first sub-pixel 411*a* may be substantially the same as a size of a second light-emitting region 432 in the second sub-pixel 421*a*. For example, an area of the first light-emitting region 431 may be substantially the same as an area of the second light-emitting region 432. However, it is not limited thereto. For example, the size of the first light-emitting region 431 may be greater than the size of the second light-emitting region 432. However, it is not limited thereto. For example, the size of the first light-emitting region 431 may be greater than the size of the second light-emitting region 432. For example, each of the plurality of first sub-pixels 411 may be referred to as a narrow sub-pixel, and each of the plurality of second sub-pixels 421 may be referred to as a wide sub-pixel.

According to an embodiment, the display 400 may include a plurality of first opaque members 440. The plurality of first opaque members 440 may be an opaque member including openings corresponding to sub-pixels. The plurality of first opaque members 440 may be integrally formed on the same plane. The plurality of first opaque members 440 may include one or more opaque members. The plurality of first opaque members 440 may be disposed in the first portion 401 of the display 400 in which the plurality of first sub-pixels 411 are disposed such that the first viewing angle of each of the plurality of first sub-pixels 411 is narrower than the second viewing angle of each of the plurality of second sub-pixels 421. The plurality of first opaque members 440 may decrease the first viewing angle of the first sub-pixel 411*a* such that the first viewing angle of the first sub-pixel 411*a* is narrower than the second viewing angle of the second sub-pixel 421*a*. The plurality of first opaque members 440 may be disposed on the first light-emitting region 431 in the first sub-pixel 411*a*. For example, the plurality of first opaque members 440 may overlap, when the display 400 is viewed from above, a portion of the first light-emitting region 431. For example, when the display 400 is viewed from above, the plurality of first opaque members 440 may not overlap the second light-emitting region 432 in the second sub-pixel 421*a*. For example, the plurality of first opaque members 440 may be disposed only in the first portion 401 of the first portion 401 and the second portion 402 of the display 400, but are not limited thereto. For example, the plurality of first opaque members 440 may be disposed in the second portion 402 of the display 400 so as not to overlap the second light-emitting region 432. According to an embodiment, when the display 400 is viewed from above, a shape of each of the plurality of first sub-pixels 411 and the plurality of second sub-pixels 421 may be quadrangular. However, it is not limited thereto. According to an embodiment, shapes of each of the plurality of first sub-pixels 411 may also be different from each other. For example, a portion of sub-pixels of the plurality of first sub-pixels 411 may be circular, and another portion of sub-pixels of the plurality of first sub-pixels 411 may be quadrangular. For example, shapes of sub-pixels in the plurality of first sub-pixels 411 may be different according to a color of light emitted from the sub-pixels. For example, among the plurality of first sub-pixels 411, a shape of a sub-pixel for emitting green light, a shape of a sub-pixel for emitting red light, and a shape of a sub-pixel for emitting blue light may be different from each other. According to an embodiment, shapes of each of the plurality of second sub-pixels 421 may also be different from each other. For example, a portion of sub-pixels of the plurality of second sub-pixels 421 may be circular, and another portion of sub-pixels of the plurality of second sub-pixels 421 may be quadrangular. For example, shapes of sub-pixels in the plurality of second sub-pixels 421 may be different according to a color of light emitted from the sub-pixels. For example, among the plurality of second sub-pixels 421, a shape of a sub-pixel for emitting green light, a shape of a sub-pixel for emitting red light, and a shape of a sub-pixel for emitting blue light may be different from each other.

According to an embodiment, the display driving circuitry 230 may control the display 400. The display driving circuitry 230 may control driving of each of the plurality of first pixels 410 and/or the plurality of second pixels 420 in the display 400. For example, the display driving circuitry 230 may control the driving of the display 400 by activating or deactivating at least a portion of the plurality of first sub-pixels 411, and/or at least a portion of the plurality of second sub-pixels 421. According to an embodiment, a state of the display driving circuitry 230 may include a first state and/or a second state. For example, each of the first state and the second state of the display driving circuitry 230 may be referred to as a first state and a second state of the display 400, respectively.

According to an embodiment, the display driving circuitry 230 may be configured to display a screen on the display 400 based on activating the plurality of first pixels 410 and the plurality of second pixels 420 in the first state. For example, the display driving circuitry 230 may display a screen on the display 400 based on activating the plurality of first sub-pixels 411 and the plurality of second sub-pixels 421 in the first state. The first state may be referred to, for example, as a first mode. For example, the first state may be referred to as a normal state and/or a normal mode.

According to an embodiment, the display driving circuitry 230 may display a screen on the display 400 based on activating the plurality of first pixels 410 and deactivating at least a portion of the plurality of second pixels 420 in the second state. For example, the display driving circuitry 230 may display a screen on the display 400 based on activating the plurality of first sub-pixels 411 and deactivating at least the portion of the plurality of second sub-pixels 421 in the second state. For example, the display driving circuitry 230 may display a screen on the display 400 based on deactivating all of the plurality of second sub-pixels 421 and activating the plurality of first sub-pixels 411 in the second state. For example, the display driving circuitry 230 may display a screen on the display 400 based on deactivating a portion of the plurality of second sub-pixels 421 and activating the plurality of first sub-pixels 411 in the second state. The second state may be referred to, for example, as a second mode or a private mode. Since at least a portion of the plurality of second sub-pixels 421 having a viewing angle wider than the plurality of first sub-pixels 411 are deactivated in the second state, a viewing angle of the screen displayed on the display 400 in the second state may be narrower than a viewing angle of the screen displayed on the display 400 in the first state. Since the viewing angle of the screen displayed on the display 400 in the second state is relatively narrow, the electronic device 101 may provide visual information to a user of the electronic device 101 without exposing the screen of the display 400 to another person other than the user of the electronic device 101. As the screen of the display 400 is not exposed to the other person other than the user, a privacy of the user of the electronic device 101 may be protected.

Hereinafter, a structure of the display 400 for providing the second state of the display driving circuitry 230 will be described.

Meanwhile, in FIG. 3, the display 400 is illustrated to be disposed on the electronic device 101 having a bar form, but is not limited thereto. For example, the electronic device 101 may be disposed on at least one of a foldable device and/or a rollable device in which a shape of the display 400 is changed. The foldable device may include a form of a multi-fold device in which the display 400 may be folded a plurality of times.

Figure 4A:
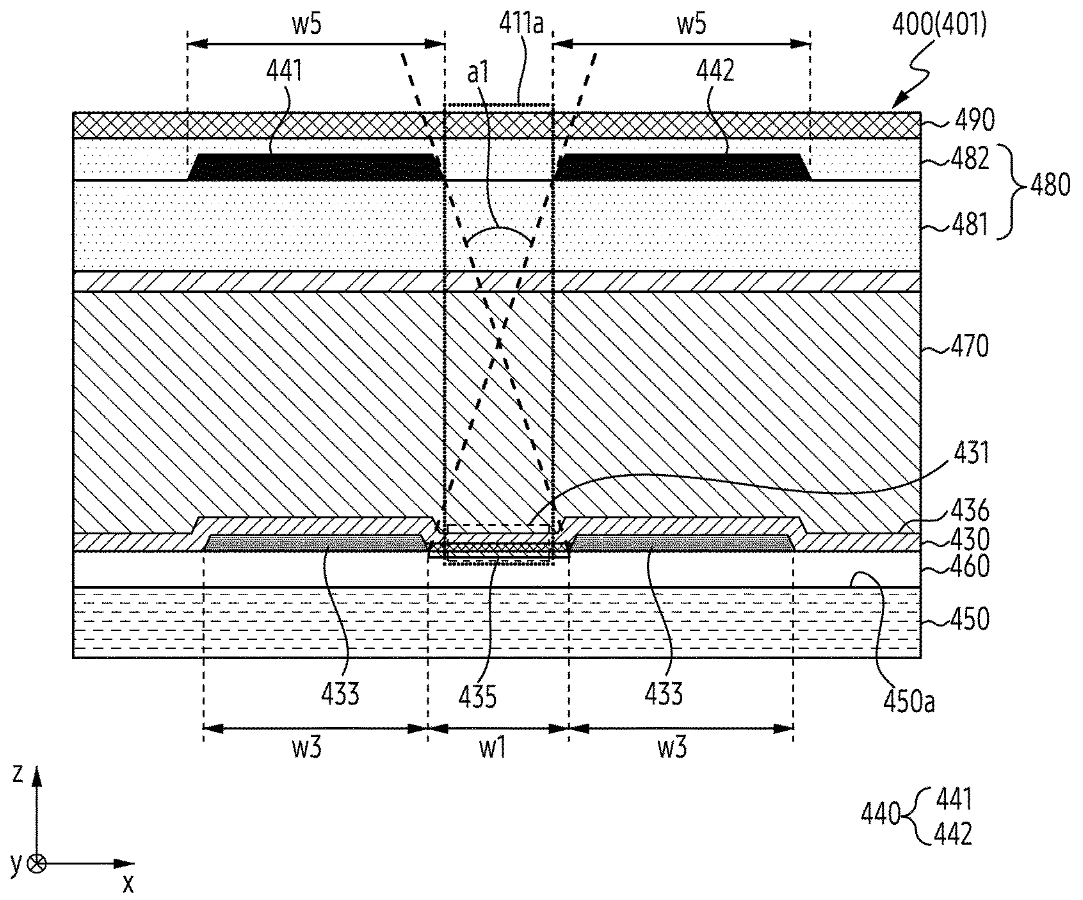
FIG. 4A is a cross-sectional view illustrating an example in which a first sub-pixel of a display is cut along line A-A' of FIG. 3 according to an embodiment of the disclosure.
Figure 4B:
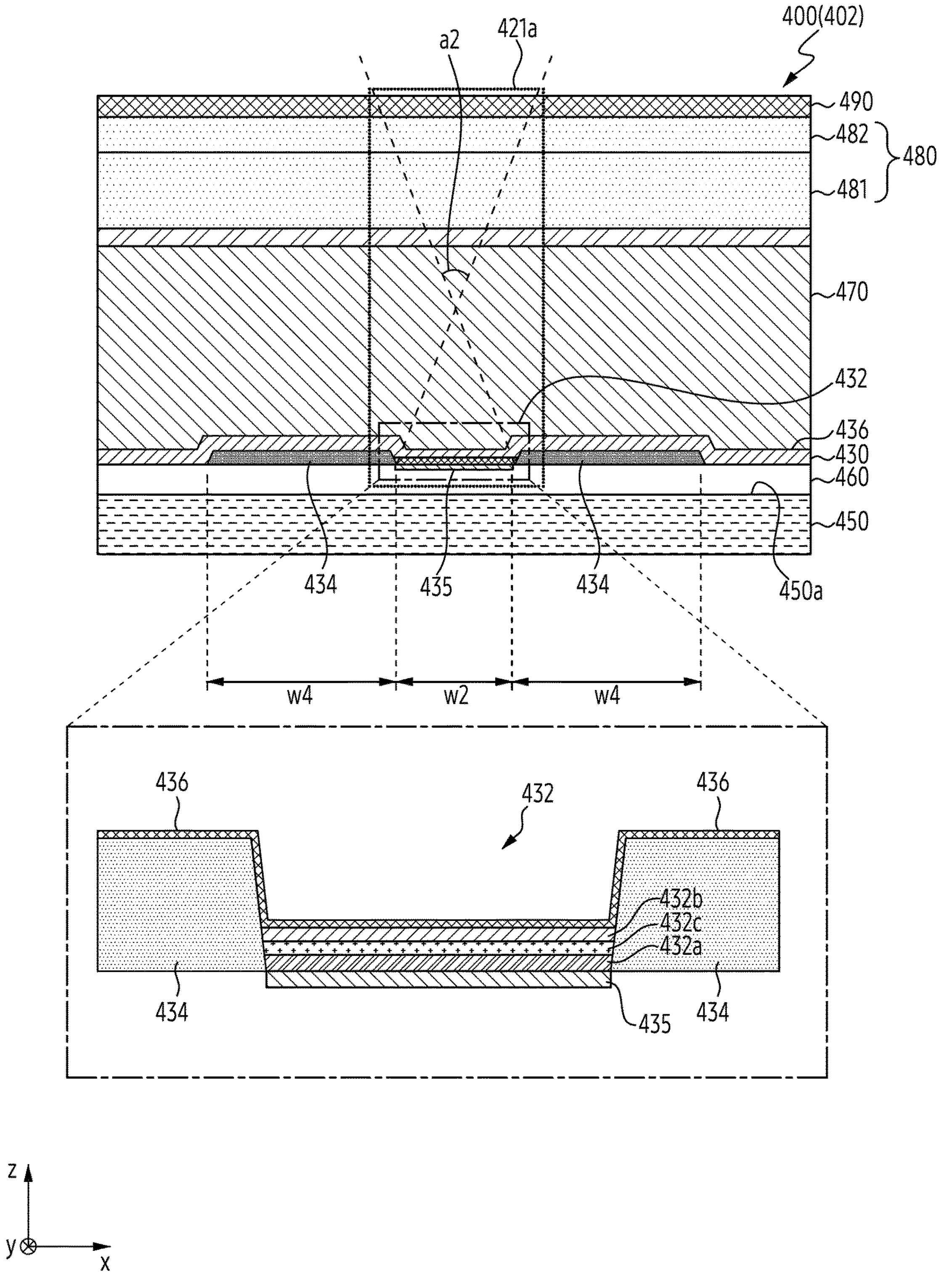
FIG. 4B is a cross-sectional view illustrating an example in which a second sub-pixel of a display is cut along line B-B' of FIG. 3 according to an embodiment of the disclosure.

FIG. 4A is a cross-sectional view illustrating an example in which a first sub-pixel of a display is cut along line A-A' of FIG. 3 according to an embodiment of the disclosure, and FIG. 4B is a cross-sectional view illustrating an example in which a second sub-pixel of a display is cut along line B-B' of FIG. 3 according to an embodiment of the disclosure.

FIG. 4A may be a cross-sectional view of a first portion 401 of a display 400 in which a first sub-pixel 411*a* is disposed, and FIG. 4B may be a cross-sectional view of a second portion 402 of the display 400 in which a second sub-pixel 421*a* is disposed.

Meanwhile, hereinafter, a structure of the display 400 will be described based on the first sub-pixel 411*a* and the second sub-pixel 421*a*, but it is for convenience of description. For example, a description of the first sub-pixel 411*a* may be applied substantially identically to each of a plurality of first sub-pixels (e.g., the plurality of first sub-pixels 411 of FIG. 3). For example, a description of the second sub-pixel 421*a* may be applied substantially identically to each of the plurality of second sub-pixels (e.g., the plurality of second sub-pixels 421 of FIG. 3).

Referring to FIGS. 4A and 4B, according to an embodiment, the display 400 may include a light-emitting layer 430, a plurality of first opaque members 440, a substrate 450, a thin film transistor (TFT) layer 460, an encapsulation layer 470, at least one planarization layer 480, and/or a window 490.

According to an embodiment, the light-emitting layer 430 may be disposed on (or over) the substrate 450. For example, the light-emitting layer 430 may be disposed on (or over) a surface 450*a* of the substrate 450. The light-emitting layer 430 may be disposed in the first portion 401 and the second portion 402 of the display 400. For example, a portion of the light-emitting layer 430 in the first portion 401 of the display 400 may be integrally formed (or defined) with another portion of the light-emitting layer 430 in the second portion 402 of the display 400. According to an embodiment, the light-emitting layer 430 may include a first light-emitting region 431, a second light-emitting region 432, a plurality of first partition walls 433, a plurality of second partition walls 434, at least one first electrode 435, and/or at least one second electrode 436.

According to an embodiment, the first light-emitting region 431 may be configured to emit light. For example, the first light-emitting region 431 may be configured to emit light along a direction (e.g., a +z direction) toward which the surface 450*a* of the substrate 450 faces. The first light-emitting region 431 may be disposed on (or over) the substrate 450. According to an embodiment, the first light-emitting region 431 may be disposed in the first portion 401 of the display 400. For example, the first light-emitting region 431 may define (or form) the first sub-pixel 411*a* of the display 400. For example, the first light-emitting region 431 may be disposed in the first sub-pixel 411*a*. According to an embodiment, the first light-emitting region 431 may be disposed between the plurality of first partition walls 433. For example, the first light-emitting region 431 may be surrounded (or covered) by the plurality of first partition walls 433.

According to an embodiment, the second light-emitting region 432 may be configured to emit light. For example, the second light-emitting region 432 may be configured to emit light along the direction (e.g., the +z direction) toward which the surface 450*a* of the substrate 450 faces. The second light-emitting region 432 may be disposed on (or over) the substrate 450. According to an embodiment, the second light-emitting region 432 may be disposed in the second portion 402 of the display 400. For example, the second light-emitting region 432 may define (or form) the second sub-pixel 421*a* of the display 400. For example, the second light-emitting region 432 may be disposed in the second sub-pixel 421*a*. According to an embodiment, the second light-emitting region 432 may be disposed between the plurality of second partition walls 434. For example, the second light-emitting region 432 may be surrounded (or covered) by the plurality of second partition walls 434. According to an embodiment, a first width w1 of the first light-emitting region 431 in the first portion 401 may be substantially the same as a second width w2 of the second light-emitting region 432 in the second portion 402. A width of a component may indicate a distance in a direction (e.g., a +x direction and/or a −x direction) substantially perpendicular to a direction (e.g., the +z direction) toward which the surface 450*a* of the substrate 450 faces, and the corresponding expression may be used substantially the same below unless otherwise stated.

According to an embodiment, the plurality of first partition walls 433 may define the first sub-pixel 411*a*. The plurality of first partition walls 433 may define (or distinguish) each of a plurality of first sub-pixels 411. The plurality of first partition walls 433 may be spaced apart from each other. For example, the plurality of first partition walls 433 may be spaced apart from each other along the direction (e.g., the +x direction and/or the −x direction) substantially perpendicular to the direction (e.g., the +z direction) toward which the surface 450*a* of the substrate 450 faces. The plurality of first partition walls 433 may be disposed in the first portion 401 of the display 400. For example, the plurality of first partition walls 433 may be referred to as a first pixel defining layer (PDL).

According to an embodiment, the plurality of second partition walls 434 may define the second sub-pixel 421*a*. The plurality of second partition walls 434 may define (or distinguish) each of a plurality of second sub-pixels 421. The plurality of second partition walls 434 may be spaced apart from each other. For example, the plurality of second partition walls 434 may be spaced apart from each other along the direction (e.g., the +x direction and/or the −x direction) substantially perpendicular to the direction (e.g., the +z direction) toward which the surface 450*a* of the substrate 450 faces. The plurality of second partition walls 434 may be disposed in the second portion 402 of the display 400. According to an embodiment, a third width w3 of each of the plurality of first partition walls 433 in the first portion 401 may be substantially the same as a fourth width w4 of each of the plurality of second partition walls 434 in the second portion 402. For example, the plurality of second partition walls 434 may be referred to as a second pixel defining layer (PDL).

According to an embodiment, the at least one first electrode 435 may be disposed on (or over) the substrate 450. The at least one first electrode 435 may be disposed in the first portion 401 and the second portion 402 of the display 400. For example, the at least one first electrode 435 may be an anode that transfers a hole to each of the first light-emitting region 431 and the second light-emitting region 432 such that each of the first light-emitting region 431 and the second light-emitting region 432 emits, but is not limited thereto. The at least one first electrode 435 may be disposed between the plurality of first partition walls 433. For example, the at least one first electrode 435 may be surrounded (or covered) by the plurality of first partition walls 433. For example, the number of the at least one first electrode 435 may be substantially the same as a sum of the number of the plurality of first sub-pixels 411 and the number of the plurality of second sub-pixels 421. For example, in a case that the at least one first electrode 435 includes a plurality of first electrodes, the plurality of first electrodes may be spaced apart from each other. For example, the at least one first electrode 435 may define each of a size of the first light-emitting region 431 and a size of the second light-emitting region 432. For example, a size of the at least one first electrode 435 may define each of the size of the first light-emitting region 431 and the size of the second light-emitting region 432. The size of the first light-emitting region 431 may correspond to the size of the at least one first electrode 435 in the first sub-pixel 411*a*. For example, the size of the second light-emitting region 432 may correspond to the size of the at least one first electrode 435 in the second sub-pixel 421*a*.

According to an embodiment, the at least one second electrode 436 may be disposed in the first portion 401 and the second portion 402 of the display 400. For example, the at least one second electrode 436 may be a cathode that transfers an electron to each of the first light-emitting region 431 and the second light-emitting region 432 such that each of the first light-emitting region 431 and the second light-emitting region 432 emits, but is not limited thereto. The at least one second electrode 436 may be disposed on the plurality of first partition walls 433. For example, the at least one second electrode 436 may surround (or cover) the plurality of first partition walls 433. For example, the at least one second electrode 436 may have a shape extending along the plurality of first partition walls 433. The at least one second electrode 436 may be disposed on the plurality of second partition walls 434. For example, the at least one second electrode 436 may surround (or cover) the plurality of second partition walls 434. For example, the at least one second electrode 436 may have a shape extending along the plurality of second partition walls 434.

According to an embodiment, the substrate 450 may support various components included in the display 400. For example, the substrate 450 may support the light-emitting layer 430. The substrate 450 may be disposed in the first portion 401 and the second portion 402 of the display 400.

According to an embodiment, the TFT layer 460 may be disposed on the substrate 450. The TFT layer 460 may be disposed between the substrate 450 and the light-emitting layer 430. The TFT layer 460 may include thin film transistors (TFTs) to control driving of the first sub-pixel 411*a* and the second sub-pixel 421*a*. For example, the TFT layer 460 may be formed based on low temperature polycrystalline silicon (LTPS) or low temperature polycrystalline oxide (LTPO). The TFT layer 460 may be disposed in the first portion 401 and the second portion 402 of the display 400.

Referring to FIG. 4B, according to an embodiment, the second light-emitting region 432 may include a hole layer 432*a*, an electron layer 432*b*, and/or an organic layer 432*c*. Hereinafter, an operation of the second light-emitting region 432 will be described based on the second light-emitting region 432, but a description of the second light-emitting region 432 may be applied substantially identically to the first light-emitting region 431.

According to an embodiment, the hole layer 432*a* may be electrically connected to the at least one first electrode 435. The hole layer 432*a* may be disposed on the at least one first electrode 435. The hole layer 432*a* may transfer a hole from the at least one first electrode 435 to the organic layer 432*c*. The hole layer 432*a* may include, for example, a hole injection layer (HIL) and a hole transporting layer (HTL).

According to an embodiment, the electron layer 432*b* may be electrically connected to the at least one second electrode 436. The electron layer 432*b* may be disposed on the organic layer 432*c*. The electron layer 432*b* may transfer an electron from the at least one second electrode 436 to the organic layer 432*c*. For example, the electron layer 432*b* may include an electron injection layer (EIL) and an electron transporting layer (ETL).

According to an embodiment, the organic layer 432*c* may include an organic light-emitting material that may emit light. The organic layer 432*c* may emit based on receiving a hole from the hole layer 432*a* and an electron from the electron layer 432*b*. The organic layer 432*c* may be disposed (or interposed) between the hole layer 432*a* and the electron layer 432*b*. Light from the organic layer 432*c* may be transmitted (or emitted) to the outside of the display 400 along the direction (e.g., the +z direction) toward which the surface 450*a* of the substrate 450 faces.

Referring to FIG. 4A, according to an embodiment, the plurality of first opaque members 440 may define the first sub-pixel 411*a*. For example, the plurality of first opaque members 440 may absorb a portion of light from the first light-emitting region 431 such that a first viewing angle a1 of the first sub-pixel 411*a* is narrower than a second viewing angle a2 of the second sub-pixel 421*a*. The plurality of first opaque members 440 may be spaced apart from each other. For example, the plurality of first opaque members 440 may be spaced apart from each other in the direction (e.g., the +x direction and/or the −x direction) substantially perpendicular to the direction (e.g., the +z direction) toward which the surface 450*a* of the substrate 450 faces. For example, the plurality of first opaque members 440 may be referred to as a plurality of black matrices (BMs) and a plurality of shading members.

According to an embodiment, the plurality of first opaque members 440 may be disposed in the first portion 401 of the first portion 401 and the second portion 402 of the display 400. For example, the plurality of first opaque members 440 may be omitted in the second portion 402. For example, the plurality of first opaque members 440 may be disposed outside the second portion 402. According to an embodiment, the plurality of first opaque members 440 may be disposed on (or over) the plurality of first partition walls 433. For example, the plurality of first opaque members 440 may be spaced apart from the plurality of first partition walls 433 along the direction (e.g., the +z direction) toward which the surface 450*a* of the substrate 450 faces.

According to an embodiment, a portion of the plurality of first opaque members 440 may be disposed on the first light-emitting region 431. A portion of each of the plurality of first opaque members 440 may overlap the first light-emitting region 431. For example, a portion of one 441 of the plurality of first opaque members 440 may overlap a portion of the first light-emitting region 431. For example, a portion of another one 442 of the plurality of first opaque members 440 may overlap another portion of the first light-emitting region 431. For example, a fifth width w5 of each of the plurality of first opaque members 440 may be greater than the third width w3 of each of the plurality of first partition walls 433. Since the fifth width w5 is greater than the third width w3, a portion of each of the plurality of first opaque members 440 may cover the first light-emitting region 431. For example, the portion of each of the plurality of first opaque members 440 may overlap a portion of the first electrode 435 in the first light-emitting region 431. For example, a distance between the plurality of first opaque members 440 disposed on (or over) the first light-emitting region 431 may be smaller than the first width w1 of the first light-emitting region 431. For example, an area (or a size) of a portion of the first light-emitting region 431 overlapping each of the plurality of first opaque members 440 may be smaller than an area (or a size) of a remaining portion of the first light-emitting region 431. As the portion of each of the plurality of first opaque members 440 covers the first light-emitting region 431, the first viewing angle a1 of the first sub-pixel 411*a* may be narrower than the second viewing angle a2 of the second light-emitting region 432. For example, in a case of relatively decreasing the size of the first light-emitting region 431 to reduce the first viewing angle a1 compared to the second viewing angle a2, a luminance of light emitted to the outside of the first light-emitting region 431 may be decreased. In a case that a relatively large amount of power is supplied to the first light-emitting region 431 to compensate for the decrease in the luminance caused by the decrease in the size of the first light-emitting region 431, a life of the first light-emitting region 431 may be relatively decreased. Since the display 400 according to an embodiment utilizes the plurality of first opaque members 440 to reduce the first viewing angle a1 of the first light-emitting region 431 having a size substantially the same as the size of the second light-emitting region 432 compared to the second viewing angle a2, it may provide a structure capable of protecting a privacy of the user while securing the life of the display 400.

Referring to FIGS. 4A and 4B, according to an embodiment, the encapsulation layer 470 may encapsulate the light-emitting layer 430. For example, the encapsulation layer 470 may decrease (or block) an inflow of a foreign substance (e.g., moisture) and/or oxygen into the first light-emitting region 431 and the second light-emitting region 432. The encapsulation layer 470 may be disposed on the light-emitting layer 430. For example, the encapsulation layer 470 may be in contact with the light-emitting layer 430. The encapsulation layer 470 may be formed of one or more inorganic films stacked on each other. For example, the encapsulation layer 470 may include one or more organic films and one or more inorganic films stacked on each other. For example, the encapsulation layer 470 may be referred to as a thin film encapsulation layer (TFE).

According to an embodiment, the at least one planarization layer 480 (flattening layer) may compensate for (or remove) a step difference of the display 400. The at least one planarization layer 480 may be disposed (or interposed) between the encapsulation layer 470 and the window 490. For example, the at least one planarization layer 480 may be referred to as an over coat (OC) and/or a passivation layer. According to an embodiment, the at least one planarization layer 480 may include a first planarization layer 481 and/or a second planarization layer 482.

According to an embodiment, the first planarization layer 481 may be disposed on the encapsulation layer 470. For example, the first planarization layer 481 may be disposed (or interposed) between the encapsulation layer 470 and the second planarization layer 482.

According to an embodiment, the second planarization layer 482 may be disposed on the first planarization layer 481. The second planarization layer 482 may be disposed (or interposed) between the window 490 and the first planarization layer 481. The second planarization layer 482 may accommodate the plurality of first opaque members 440 in the first portion 401. For example, the second planarization layer 482 may surround (or cover) the plurality of first opaque members 440 in the first portion 401.

According to an embodiment, the plurality of first opaque members 440 may be disposed on the first planarization layer 481. For example, the plurality of first opaque members 440 may be inserted into the second planarization layer 482.

According to an embodiment, the window 490 may protect components in the display 400. For example, the window 490 may be exposed to the outside of display 400. In a case that the window 490 is exposed to the outside of the display 400, the window 490 may define (or form) an outer surface of the display 400, but is not limited thereto. The window 490 may be disposed on the second planarization layer 482.

Meanwhile, although not illustrated in FIGS. 4A and 4B, the display 400 of FIGS. 4A and 4B may further include a polarization layer. The polarization layer may decrease an amount of light reflected in the display 400 after being incident from the outside of the display 400. As the amount of light reflected in the display 400 is decreased by the polarization layer, visibility of the display 400 may be improved.

Meanwhile, in FIGS. 4A and 4B, it is illustrated that the plurality of first opaque members 440 are disposed only in the first portion 401 of the first portion 401 and the second portion 402, but embodiments are not limited thereto. For example, the plurality of first opaque members 440 may be disposed in the second portion 402. In a case that the plurality of first opaque members 440 are disposed in the second portion 402, each of the plurality of first opaque members 440 may not overlap the second light-emitting region 432. For example, in a case that the plurality of first opaque members 440 are disposed in the second portion 402, a width of each of the plurality of first opaque members 440 in the second portion 402 may be substantially the same as the fourth width w4 of each of the plurality of second partition walls 434.

As described above, the display 400 according to an embodiment may provide a structure capable of protecting the privacy of the user while securing the life of the display 400 by the plurality of first opaque members 440 limiting the first viewing angle a1 of the first light-emitting region 431.

Figure 5:
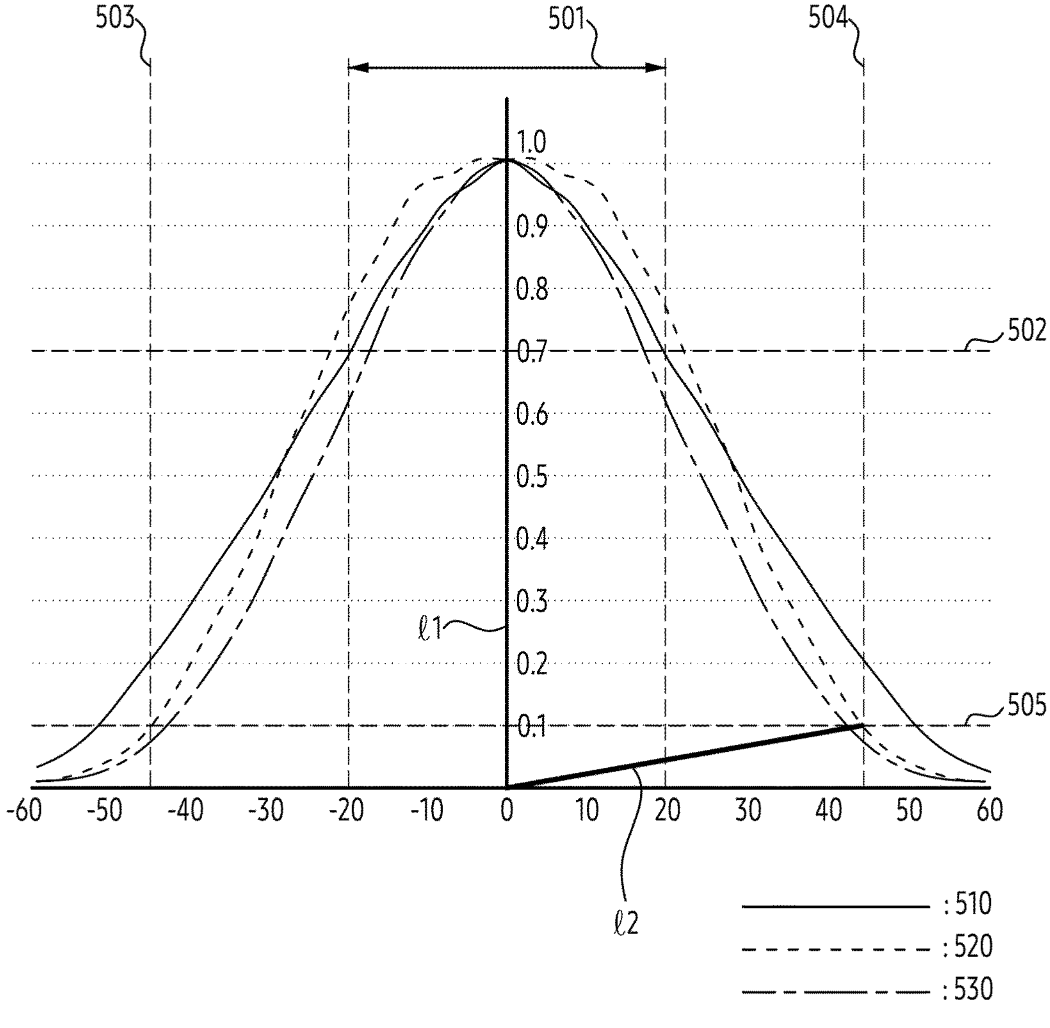
FIG. 5 is a graph indicating a relationship between an angle and a luminance ratio of each of a first sub-pixel and second sub-pixel according to an embodiment of the disclosure.

FIG. 5 is a graph indicating a relationship between an angle and a luminance ratio of each of a first sub-pixel and second sub-pixel according to an embodiment of the disclosure.

In the graph of FIG. 5, a horizontal axis indicates the angle and a vertical axis indicates the luminance ratio. The luminance ratio may indicate a ratio of a luminance according to a specific angle with respect to a luminance value according to 0 degrees. For example, as the luminance ratio according to the specific angle becomes greater, the luminance according to the specific angle may be greater.

A first graph 510 of FIG. 5 illustrates a relationship of a luminance ratio of the first sub-pixel (e.g., the first sub-pixel 411*a* of FIG. 3) according to an angle, a second graph 520 illustrates a relationship of a luminance ratio of the second sub-pixel (e.g., the second sub-pixel 421*a* of FIG. 3) according to an angle, and a third graph 530 illustrates a relationship between an angle and another sub-pixel including another light-emitting region having a size smaller than a second light-emitting region (e.g., the second light-emitting region 432 of FIG. 3). The graphs 510, 520, and 530 of FIG. 5 may be obtained while substantially the same power is supplied to each of a first sub-pixel 411*a*, a second sub-pixel 421*a*, and another sub-pixel.

Referring to FIG. 5, at 0 degrees, the first graph 510, the second graph 520, and the third graph 530 may have a maximum value. 0 degrees may indicate an angle when each of the first sub-pixel 411*a*, the second sub-pixel 421*a*, and the other sub-pixel is viewed vertically (or viewed frontally). For example, the luminance ratio according to 0 degrees may indicate a luminance ratio to a surface (e.g., the surface 450*a* of FIGS. 4A and 4B) of a substrate (e.g., the substrate 450 of FIGS. 4A and 4B). A first designated range 501 may correspond to a viewing range of a user of an electronic device (e.g., the electronic device 101 of FIG. 3). A luminance ratio of the first sub-pixel 411*a* in the first designated range 501 and a luminance ratio of the second sub-pixel 421*a* in the first designated range 501 may have a value greater than or equal to a first reference value 502. As the luminance ratio of the first sub-pixel 411*a* and the luminance ratio of the second sub-pixel 421*a* in the first designated range 501 exceed the first reference value 502, a display 400 may provide a relatively clear screen in a second state. A luminance ratio of the other sub-pixel corresponding to the third graph 530 in the first designated range 501 may not exceed the first reference value 502. For example, since the size of the other light-emitting region is smaller than a size of the second light-emitting region 432, the luminance ratio of the other sub-pixel corresponding to the third graph 530 in the first designated range 501 may not exceed the first reference value 502. As the luminance ratio of the other sub-pixel in the first designated range 501 does not exceed the first reference value 502, a screen displayed on the display 400 in the second state by the other sub-pixel may be relatively dark in a case that the second state is provided through the other sub-pixel. In a case that power supplied to the other sub-pixel is increased to improve a luminance in the first designated range 501, a life of the other sub-pixel may be relatively decreased.

According to an embodiment, an angle outside a second designated angle 503 and a third designated angle 504 may correspond to a viewing range of another person other than the user of an electronic device 101. In the angle outside the second designated angle 503 and the third designated angle 504, the luminance ratio of the first sub-pixel 411*a* corresponding to the first graph 510 may be less than a second reference value 505. In the angle outside the second designated angle 503 and the third designated angle 504, as the luminance ratio of the first sub-pixel 411*a* is less than the second reference value 505, the screen of the display 400 may not be visible by the other person other than the user of the electronic device 101 in the second state. As the screen of the display 400 is not visible by the other person in the second state, a privacy of the user of the electronic device 101 may be protected.

According to an embodiment, referring to the first graph 510, a luminance ratio of light emitted from a first light-emitting region 431 to the outside of the display 400 along a first direction 11 may be greater than a luminance ratio of light emitted from the first light-emitting region 431 to the outside of the display 400 along a second direction 12 rotated from the first direction 11. For example, the luminance ratio in the first direction 11 may correspond to a luminance ratio in a direction toward which the surface 450*a* of the substrate 450 faces. For example, the luminance ratio in the second direction 12 may indicate a luminance ratio in the angle outside the second designated angle 503 and the third designated angle 504. Referring to the second graph 520, a luminance ratio of light emitted from the second light-emitting region 432 to the outside of the display 400 along the first direction 11 may be greater than a luminance ratio of light emitted from the second light-emitting region 432 to the outside of the display 400 along the second direction 12.

According to an embodiment, referring to the first graph 510 and the second graph 520, a difference between the luminance ratio of the light emitted from the first light-emitting region 431 to the outside of the display 400 along the first direction 11 and the luminance ratio of the light emitted from the first light-emitting region 431 to the outside of the display 400 along the second direction 12 may be greater than a difference between the luminance ratio of the light emitted from the second light-emitting region 432 to the outside of the display 400 along the first direction 11 and the luminance ratio of the light emitted from the second light-emitting region 432 to the outside of the display 400 along the second direction 12.

As described above, the electronic device 101 according to an embodiment may provide a structure capable of protecting the privacy of the user without decreasing a size of the first light-emitting region 431 through a plurality of first opaque members (e.g., the plurality of first opaque members 440 of FIG. 3) partially overlapping the first light-emitting region 431.

Figure 6A:
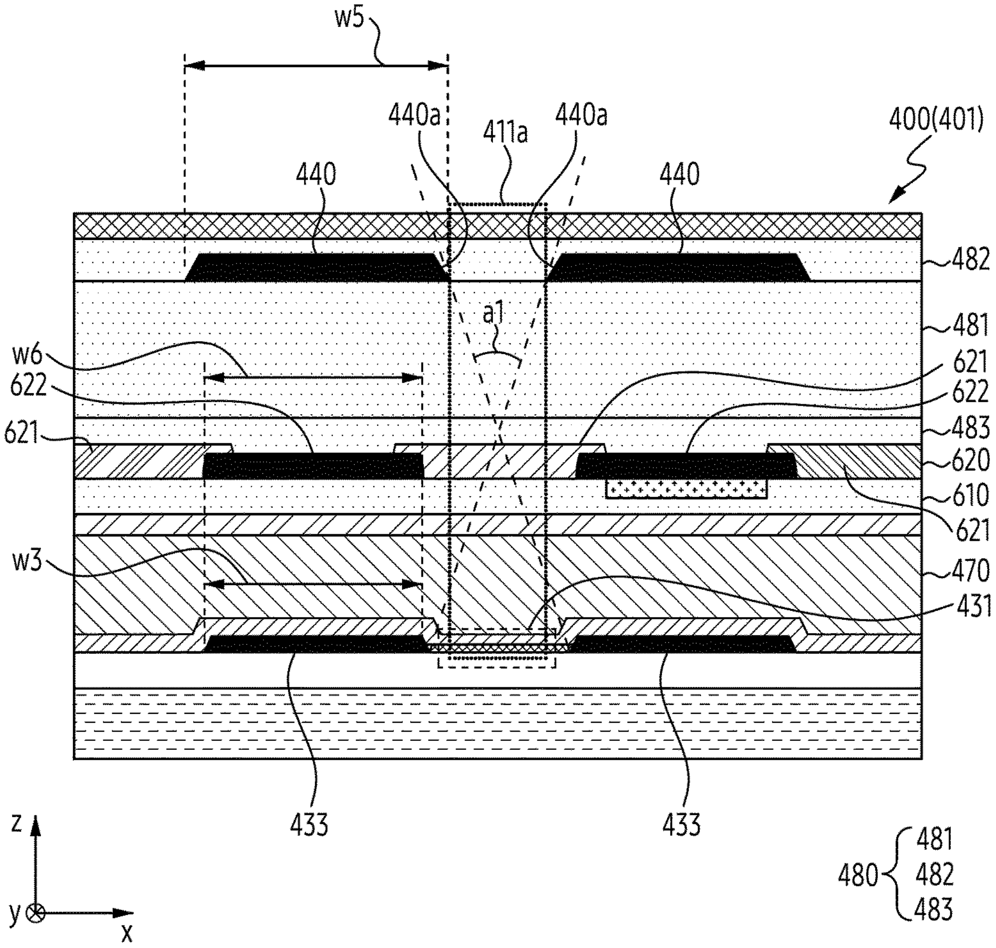
FIG. 6A is a cross-sectional view illustrating an example of cutting a first sub-pixel of a display according to an embodiment of the disclosure.
Figure 6B:
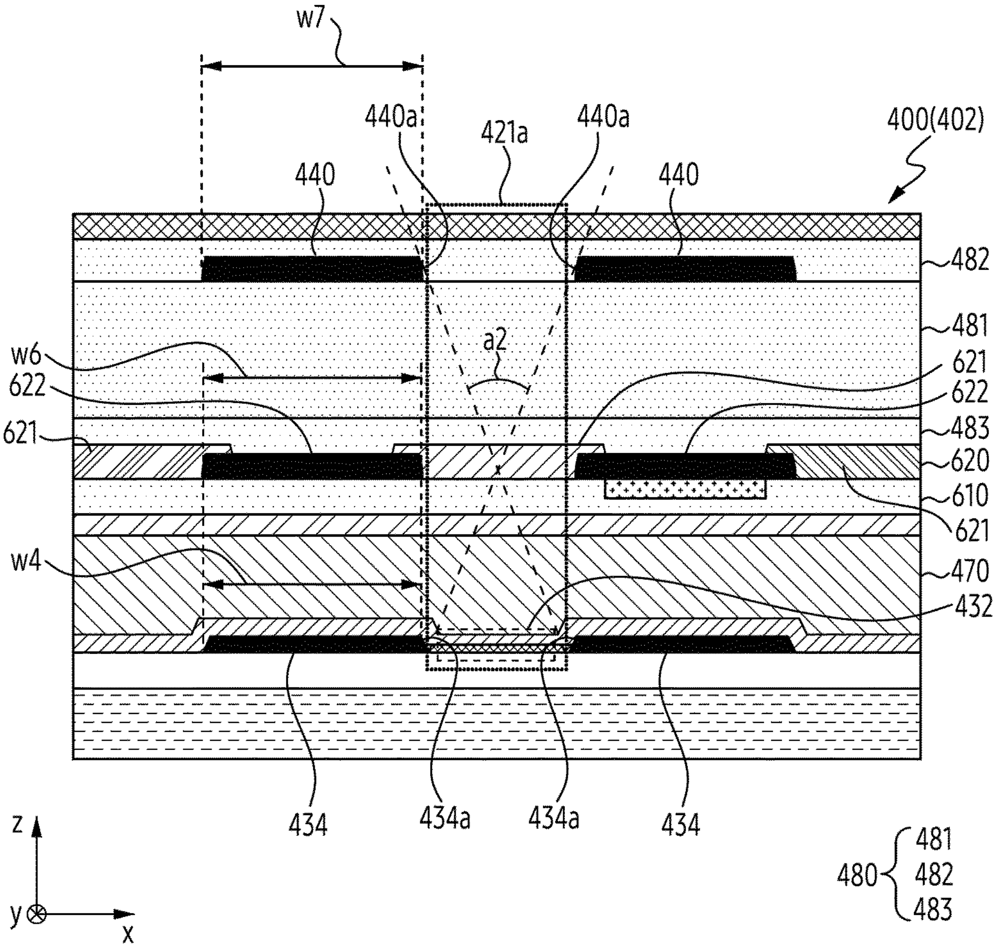
FIG. 6B is a cross-sectional view illustrating an example of cutting a second sub-pixel of a display according to an embodiment of the disclosure.

FIG. 6A is a cross-sectional view illustrating an example of cutting a first sub-pixel of a display according to an embodiment of the disclosure, and FIG. 6B is a cross-sectional view illustrating an example of cutting a second sub-pixel of a display according to an embodiment of the disclosure.

Since a display 400 of FIGS. 6A and 6B may be the display 400 to which a disposition structure of a plurality of first opaque members 440 is changed in the display 400 of FIGS. 4A and 4B, and a filter layer 620 and a touch layer 610 are added, a redundant description will be omitted.

Referring to FIGS. 6A and 6B, according to an embodiment, the display 400 may further include the touch layer 610 and/or the filter layer 620.

According to an embodiment, the touch layer 610 may be configured to receive a touch input from the outside of the display 400. The touch layer 610 may include one or more touch electrodes. For example, the touch layer 610 may obtain data for identifying an input on the display 400 as a touch input based on a change in capacitance between one or more touch electrodes. The touch layer 610 may be disposed in a first portion 401 and a second portion 402. According to an embodiment, the touch layer 610 may be disposed (or interposed) between an encapsulation layer 470 and the filter layer 620. However, it is not limited thereto. For example, the touch layer 610 may be disposed (or interposed) between the plurality of first opaque members 440 and a first planarization layer 481.

According to an embodiment, the filter layer 620 may be disposed on the encapsulation layer 470. For example, the filter layer 620 may be disposed (or interposed) between the first planarization layer 481 and a third planarization layer 483. The filter layer 620 may be disposed in a first region 601 and a second region 602. According to an embodiment, the filter layer 620 may include a plurality of color filters 621 and a plurality of second opaque members 622.

According to an embodiment, the plurality of color filters 621 may convert a wavelength of light from a first light-emitting region 431 and a second light-emitting region 432. For example, the plurality of color filters 621 may increase purity of the light from the first light-emitting region 431 and the second light-emitting region 432. According to an embodiment, the plurality of color filters 621 may be spaced apart from each other. For example, the plurality of color filters 621 may be spaced apart from each other along a direction (e.g., a +x direction and/or a −x direction) substantially perpendicular to a direction (e.g., a +z direction) toward which a surface 450*a* of a substrate 450 faces. The plurality of color filters 621 may be disposed on (or over) the first light-emitting region 431 and the second light-emitting region 432. For example, the display 400 of FIGS. 6A and 6B may not include a polarization plate for polarization, but is not limited thereto.

According to an embodiment, the plurality of second opaque members 622 may define (or distinguish) each of a first sub-pixel 411*a* and a second sub-pixel 421*a*. The plurality of second opaque members 622 may be an opaque member including openings corresponding to sub-pixels. The plurality of second opaque members 622 may include one or more opaque members. The plurality of second opaque members 622 may be formed of a material for absorbing light. For example, the plurality of second opaque members 622 may be formed of substantially the same material as the plurality of first opaque members 440. The plurality of second opaque members 622 may be disposed in the first portion 401 and the second portion 402. For example, the plurality of second opaque members 622 may be disposed on (or over) a plurality of first partition walls 433 in the first portion 401. For example, the plurality of second opaque members 622 may be disposed on (or over) a plurality of second partition walls 434 in the second portion 402. According to an embodiment, the plurality of second opaque members 622 may be disposed (or interposed) between the plurality of color filters 621. A sixth width w6 of the plurality of second opaque members 622 may be less than or equal to a third width w3 of each of the plurality of first partition walls 433, and a fourth width w4 of each of the plurality of second partition walls 434. For example, the sixth width w6 of each of the plurality of second opaque members 622 may be substantially the same as the third width w3 of each of the plurality of first partition walls 433, and the fourth width w4 of each of the plurality of second partition walls 434. As the sixth width w6 of each of the plurality of second opaque members 622 is the same as the third width w3 of each of the plurality of first partition walls 433, the plurality of second opaque members 622 may not overlap the first light-emitting region 431. For example, when the display 400 is viewed from above, the plurality of second opaque members 622 may not overlap the first light-emitting region 431. As the sixth width w6 of each of the plurality of second opaque members 622 is the same as the fourth width w4 of each of the plurality of second partition walls 434, the plurality of second opaque members 622 may not overlap the second light-emitting region 432. For example, when the display 400 is viewed from above, the plurality of second opaque members 622 may not overlap the second light-emitting region 432.

According to an embodiment, at least one planarization layer 480 may further include the third planarization layer 483. The third planarization layer 483 may be disposed (or interposed) between the first planarization layer 481 and the filter layer 620.

According to an embodiment, the plurality of first opaque members 440 may be disposed in the first portion 401 and the second portion 402 of the display 400. In the first portion 401, a portion of each of the plurality of first opaque members 440 may overlap a portion of the first light-emitting region 431 such that a first viewing angle a1 of the first sub-pixel 411*a* is narrower than a second viewing angle a2 of the second sub-pixel 421*a*. For example, in the first portion 401, an end 440*a* of each of the plurality of first opaque members 440 may overlap a portion of the first light-emitting region 431. For example, in the first portion 401, each of the plurality of first opaque members 440 may have a fifth width w5 greater than the third width w3 of each of the plurality of first partition walls 433.

According to an embodiment, in the second portion 402, each of the plurality of first opaque members 440 may not overlap the second light-emitting region 432. For example, when the display 400 is viewed from the outside, each of the plurality of first opaque members 440 may be disposed on the plurality of second partition walls 434 to be located outside the second light-emitting region 432 in the second portion 402. For example, in the second portion 402, each of the plurality of first opaque members 440 may have a seventh width w7 that is less than or equal to the fourth width w4 of each of the plurality of second partition walls 434. For example, the seventh width w7 may be substantially the same as the fourth width w4, but is not limited thereto. For example, the end 440*a* of each of the plurality of first opaque members 440 in the second portion 402 may overlap an end 434*a* of each of the plurality of second partition walls 434 in contact with the second light-emitting region 432. In the second portion 402, as each of the plurality of first opaque members 440 does not overlap the second light-emitting region 432, the second viewing angle a2 of the second sub-pixel 421*a* may be wider than the first viewing angle a1 of the first sub-pixel 411*a*.

As described above, since the fifth width w5 of each of the plurality of first opaque members 440 in the first portion 401 is greater than the seventh width w7 of each of the plurality of first opaque members 440 in the second portion 402, the display 400 according to an embodiment may provide a structure in which the first viewing angle a1 of the first sub-pixel 411*a* in the first portion 401 is narrower than the second viewing angle a2 of the second sub-pixel 421*a* in the second portion 402.

Meanwhile, the display 400 of FIGS. 6A and 6B may not include a polarization layer. In a case that the display 400 of FIGS. 6A and 6B does not include the polarization layer, each of the plurality of first partition walls 433 and the plurality of second partition walls 434 may include a material (e.g., a black-based material) for absorbing light. For example, in a case that each of the plurality of first partition walls 433 and the plurality of second partition walls 434 is formed of the material for absorbing light, the plurality of first partition walls 433 may be referred to as a first black pixel defining layer (BPDL), and the plurality of second partition walls 434 may be referred to as a second black pixel defining layer (BPDL).

Meanwhile, in FIGS. 6A and 6B, it is illustrated that the plurality of first opaque members 440 are disposed in the first portion 401 and the second portion 402, but embodiments are not limited thereto. For example, the plurality of first opaque members 440 may be disposed only in the first portion 401 of the first portion 401 and the second portion 402. For example, the plurality of first opaque members 440 may be disposed outside the second portion 402.

Figure 7:
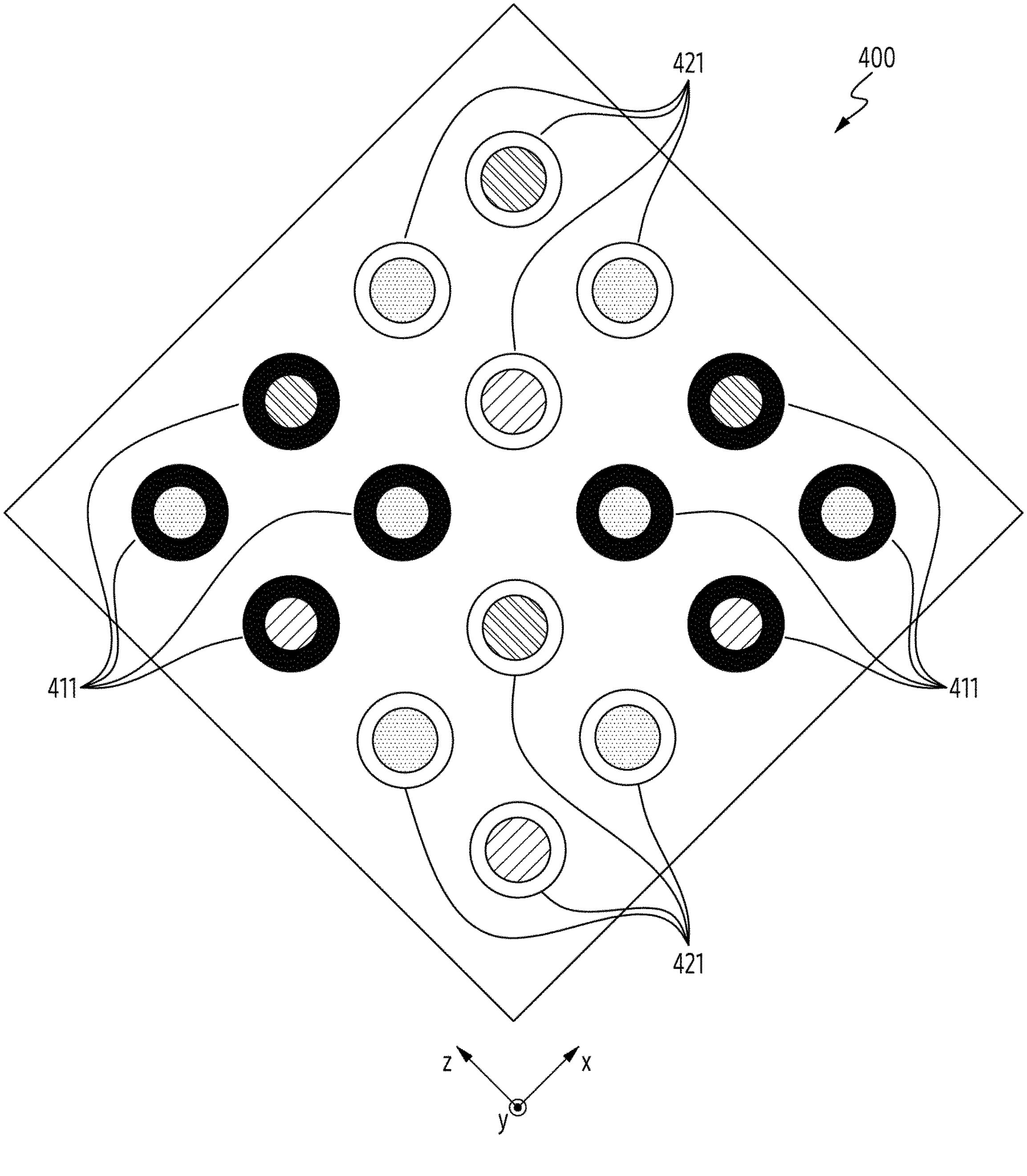
FIG. 7 is a top view between first sub-pixels and second sub-pixels of a display according to an embodiment of the disclosure.

FIG. 7 is a top view between first sub-pixels and second sub-pixels of a display according to an embodiment of the disclosure.

Referring to FIG. 7, according to an embodiment, a shape of a cross-section of each of a plurality of first sub-pixels 411 and a plurality of second sub-pixels 421 may be circular. For example, when the display 400 is viewed from above, the shape of the cross-section of each of the plurality of first sub-pixels 411 and the plurality of second sub-pixels 421 may be circular. However, it is not limited thereto. For example, the shape of the cross-section of each of the plurality of first sub-pixels 411 and the plurality of second sub-pixels 421 may be elliptical. For example, the shape of the cross-section of each of the plurality of first sub-pixels 411 and the plurality of second sub-pixels 421 may be polygonal.

Figure 8A:
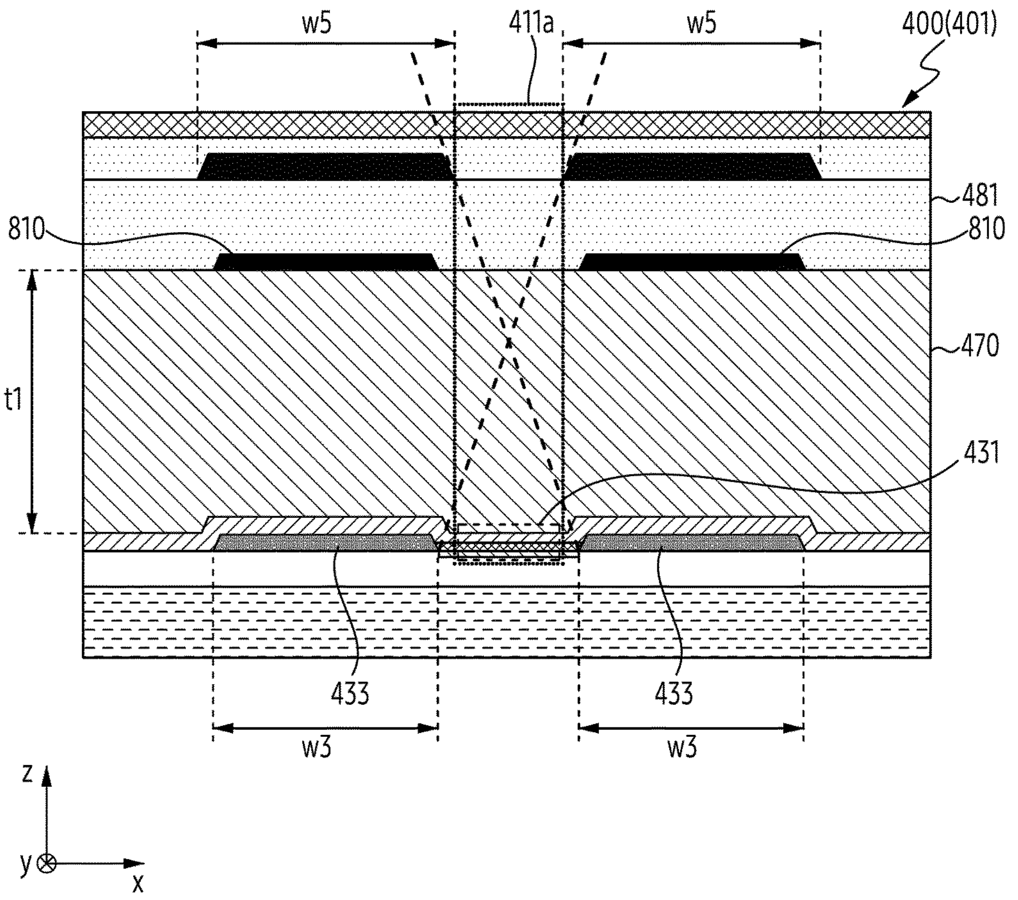
FIG. 8A is a cross-sectional view illustrating an example of cutting a first sub-pixel of a display according to an embodiment of the disclosure.
Figure 8B:
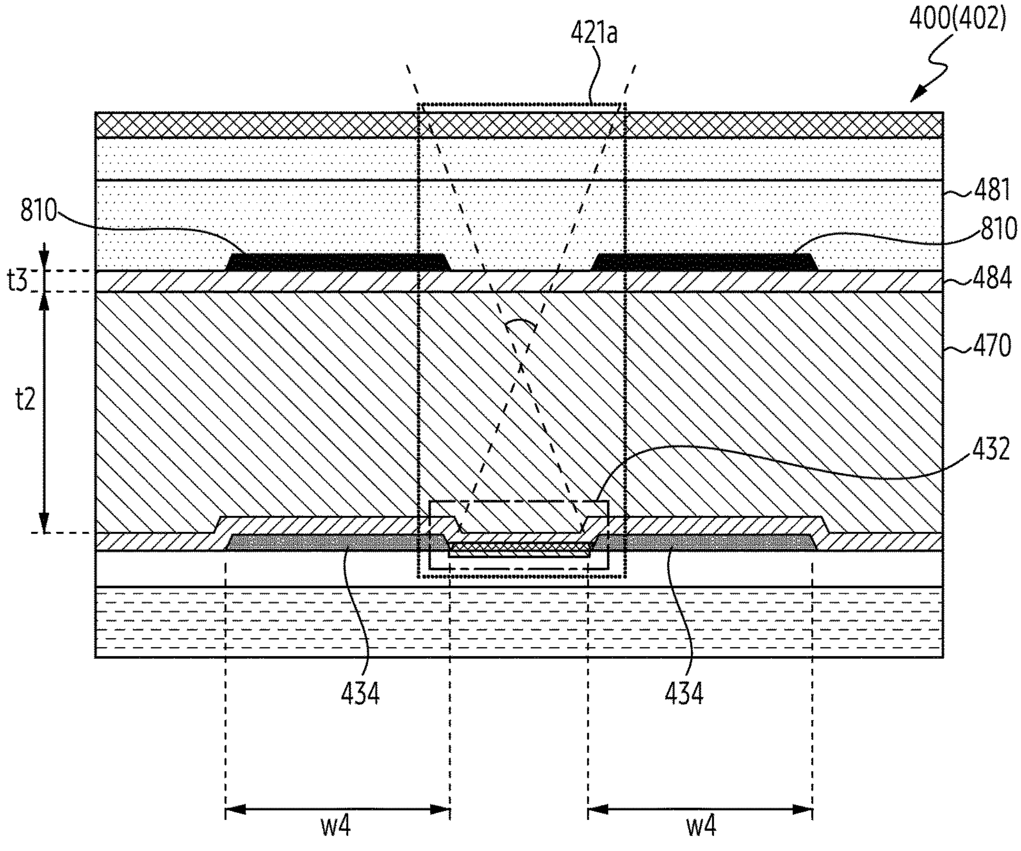
FIG. 8B is a cross-sectional view illustrating an example of cutting a second sub-pixel of a display according to an embodiment of the disclosure.

FIG. 8A is a cross-sectional view illustrating an example of cutting a first sub-pixel of a display according to an embodiment of the disclosure, and FIG. 8B is a cross-sectional view illustrating an example of cutting a second sub-pixel of a display according to an embodiment of the disclosure.

Since a display 400 of FIGS. 8A and 8B may be the display 400 to which a structure of an encapsulation layer 470 is changed in the display 400 of FIGS. 4A and 4B, and a fourth planarization layer 484 and a plurality of third opaque members 810 are added, a redundant description will be omitted.

Referring to FIGS. 8A and 8B, according to an embodiment, a first thickness t1 of the encapsulation layer 470 in a first portion 401 may be different from a second thickness t2 of the encapsulation layer 470 in a second portion 402. For example, the first thickness t1 of the encapsulation layer 470 in the first portion 401 may be greater than the second thickness t2 of the encapsulation layer 470 in the second portion 402.

According to an embodiment, the display 400 may further include the fourth planarization layer 484. The fourth planarization layer 484 may compensate for a difference between the first thickness t1 and the second thickness t2. For example, a third thickness t3 of the fourth planarization layer 484 may be substantially the same as the difference between the first thickness t1 and the second thickness t2. The fourth planarization layer 484 may be disposed on the encapsulation layer 470. The fourth planarization layer 484 may be disposed (or interposed) between the encapsulation layer 470 and a first planarization layer 481.

According to an embodiment, the display 400 may further include the plurality of third opaque members 810. The plurality of third opaque members 810 may be an opaque member including openings corresponding to sub-pixels. The plurality of third opaque members 810 may be integrally formed on the same plane. The plurality of third opaque members 810 may include one or more opaque members. The plurality of third opaque members 810 may decrease transmission of light emitted from a first light-emitting region 431 in the first portion 401 to another sub-pixel adjacent to a first sub-pixel 411*a*. The plurality of third opaque members 810 may decrease transmission of light emitted from a second light-emitting region 432 in the second portion 402 to another sub-pixel adjacent to a second sub-pixel 421*a*. The plurality of third opaque members 810 may be disposed on the encapsulation layer 470. For example, in the first portion 401, the plurality of third opaque members 810 may be disposed on a surface of the encapsulation layer 470 facing the first planarization layer 481. For example, in the second portion 402, the plurality of third opaque members 810 may be disposed on the fourth planarization layer 484. However, it is not limited thereto. For example, the third opaque members 810 may be disposed only in the first portion 401 of the first portion 401 and the second portion 402 of the display 400.

According to an embodiment, the plurality of third opaque members 810 may not overlap the first light-emitting region 431 and the second light-emitting region 432. For example, in the first portion 401, each of the plurality of third opaque members 810 may have a width less than or equal to a third width w3 of each of a plurality of first partition walls 433. For example, in the second portion 402, each of the plurality of third opaque members 810 may have a width less than or equal to a fourth width w4 of each of a plurality of second partition walls 434.

Figure 9:
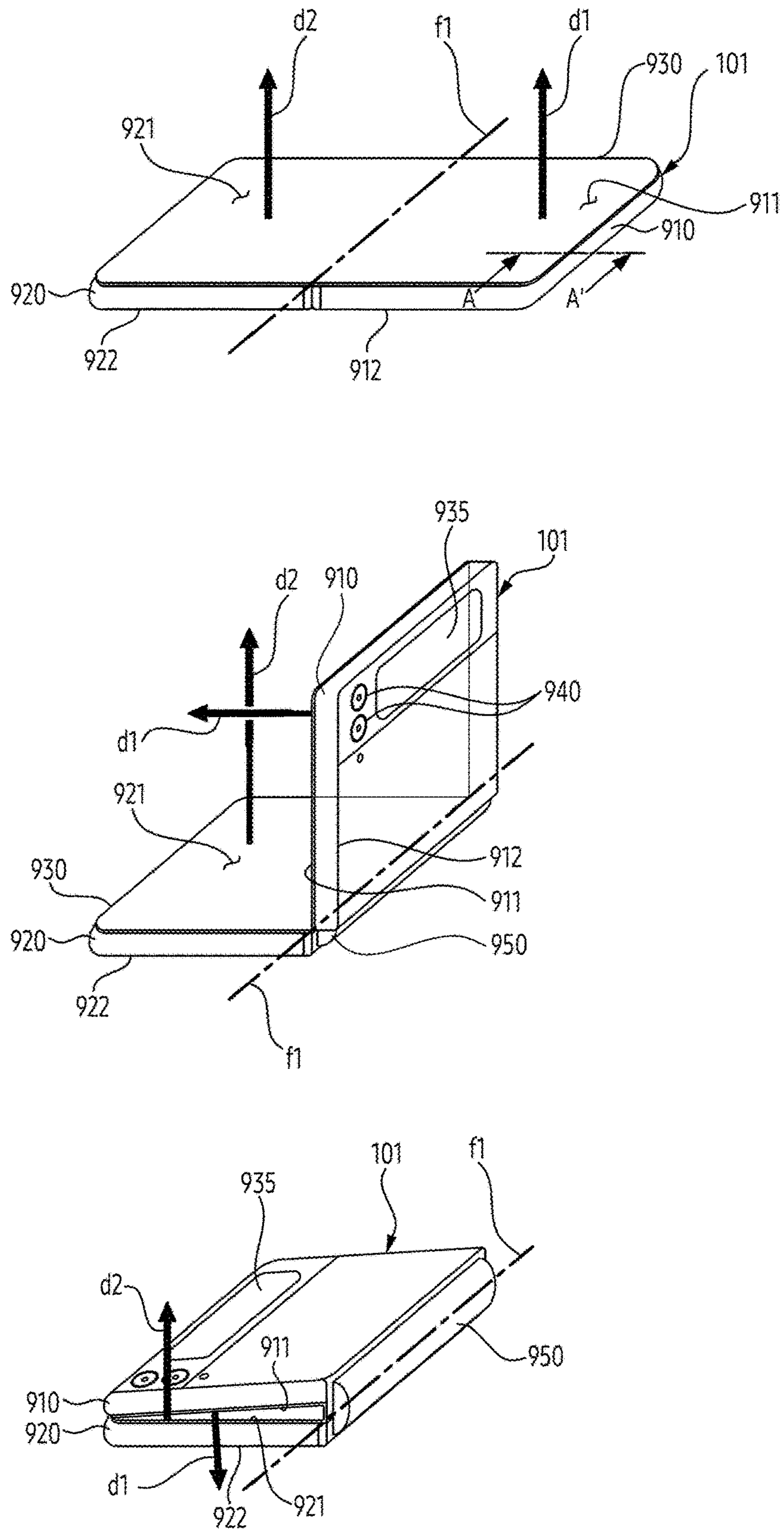
FIG. 9 is a diagram illustrating an electronic device according to an embodiment of the disclosure.

FIG. 9 is a diagram illustrating an electronic device according to an embodiment of the disclosure.

Referring to FIG. 9, an electronic device 101 may include a first housing 910, a second housing 920, a display 930 (e.g., the display 400), at least one camera 940 (e.g., the camera module 180 of FIG. 1), and/or a hinge structure 950.

According to an embodiment, the first housing 910 and the second housing 920 may form at least a portion of an outer surface of an electronic device 900 that may be gripped by a user. The at least a portion of the outer surface of the electronic device 900 defined by the first housing 910 and the second housing 920 may be in contact with a part of a body of the user when the electronic device 900 is used by the user. According to an embodiment, the first housing 910 may include a first surface 911 and a second surface 912 facing the first surface 911 and spaced apart from the first surface 911. The second surface 912 may be opposite to the first surface 911. For example, a direction toward which the second surface 912 faces may be opposite to a first direction d1 toward which the first surface 911 faces.

According to an embodiment, the second housing 920 may include a third surface 921 and a fourth surface 922 facing the third surface 921 and spaced apart from the third surface 921. The fourth surface 922 may be opposite to the third surface 921. For example, a direction toward which the fourth surface 922 faces may be opposite to a second direction d2 toward which the third surface 921 faces. According to an embodiment, the second housing 920 may be coupled to the first housing 910 to be rotatable with respect to the first housing 910.

According to an embodiment, the display 930 may be disposed on the first surface 911 of the first housing 910 and the third surface 921 of the second housing 920 across the hinge structure 950. For example, the display 930 may be referred to as a flexible display. According to an embodiment, the display 930 may further include a sub-display 935 disposed on the second surface 912 of the first housing 910. For example, the sub-display 935 may be exposed to the outside of the electronic device 900 through the second surface 912.

According to an embodiment, the display 930 may be foldable based on a folding axis f3 by movement of the second housing 920 with respect to the first housing 910. For example, the folding axis f3 may mean a virtual line extending through the hinge structure 950 in a direction substantially perpendicular to a longitudinal direction of the electronic device 900, but is not limited thereto. For example, the folding axis f3 may be a virtual line extending in a direction substantially parallel to the longitudinal direction of the electronic device 900. In a case that the folding axis f3 extends in the direction substantially parallel to the longitudinal direction of the electronic device 900, the hinge structure 950 may connect the first housing 910 and the second housing 920 by extending in a direction parallel to the folding axis f3.

According to an embodiment, the at least one camera 940 may be configured to obtain an image based on receiving light from an external subject of the electronic device 900. According to an embodiment, the at least one camera 940 is disposed inside the first housing 910, and at least a portion of the camera 940 may be visible through the second surface 912 of the first housing 910.

According to an embodiment, the hinge structure 950 may rotatably connect the first housing 910 and the second housing 920. The hinge structure 950 may be disposed between the first housing 910 and the second housing 920 of the electronic device 101 such that the electronic device 900 may be folded. The hinge structure 950 may change the electronic device 900 into an unfolding state in which the first direction d1 toward which the first surface 911 of the first housing 910 faces and the second direction d2 toward which the third surface 921 of the second housing 920 faces are substantially the same as each other, or a folding state in which the first surface 911 and the third surface 921 face each other. When the electronic device 900 is in the folded state, the first housing 910 and the second housing 920 may be stacked or overlapped such that they face each other. According to an embodiment, when the electronic device 900 is in the folded state, the first direction d1 toward which the first surface 911 faces and the second direction d2 toward which the third surface 921 faces may be different from each other. For example, when the electronic device 900 is in the folded state, the first direction d1 toward which the first surface 911 faces and the second direction d2 toward which the third surface 921 faces may be opposite to each other. However, it is not limited thereto. For example, a state of the electronic device 900 may include an intermediate state in which the first direction d1 toward which the first surface 911 faces and the second direction d2 toward which the third surface 921 faces are inclined with respect to each other. When the first direction d1 toward which the first surface 911 faces is inclined with respect to the second direction d2 toward which the third surface 921 faces, the first housing 910 may be inclined with respect to the second housing 920. For example, the intermediate state of the electronic device 900 may be referred to as a flex mode.

FIG. 9 illustrates that the display 400 is not exposed to the outside of the electronic device 900 in the folded state of the electronic device 900, but is not limited thereto. For example, the second housing 920 may be rotatable with respect to the first housing 910 such that the second surface 912 and the fourth surface 922 face each other in the folded state of the electronic device 900. For example, the second housing 920 may be rotatable with respect to the first housing 910 such that the display 400 is directly exposed to the outside of the electronic device 900 in the folded state of the electronic device 900.

Figure 10A:
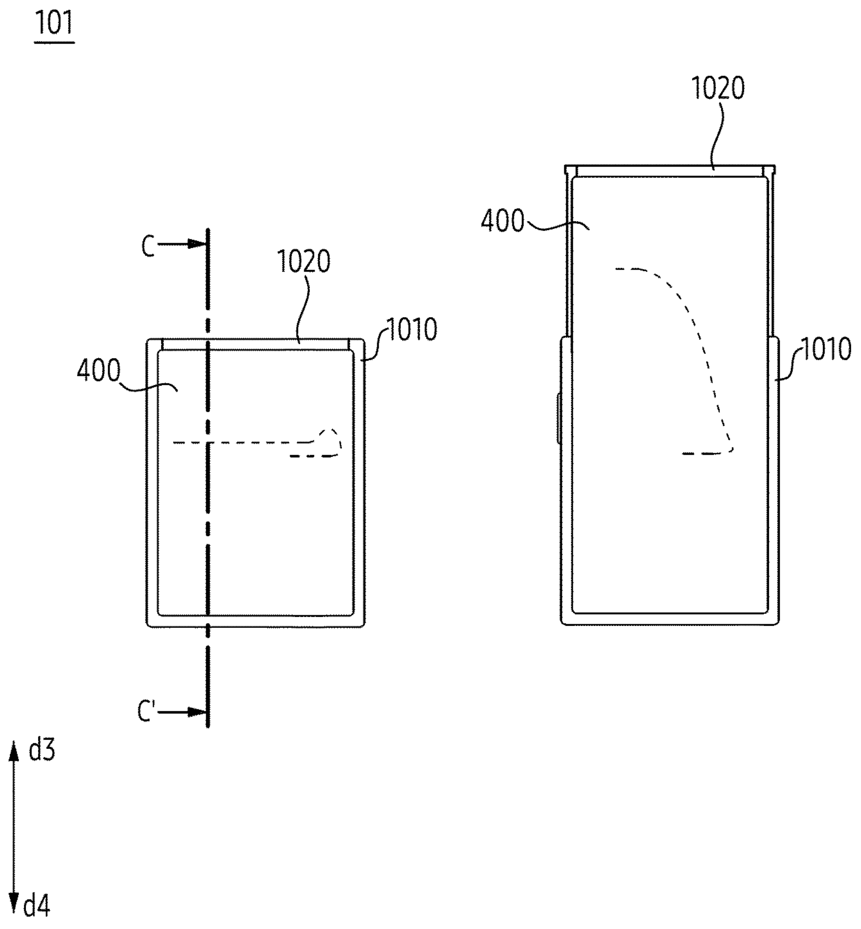
FIG. 10A is a diagram illustrating an electronic device according to an embodiment of the disclosure.
Figure 10B:
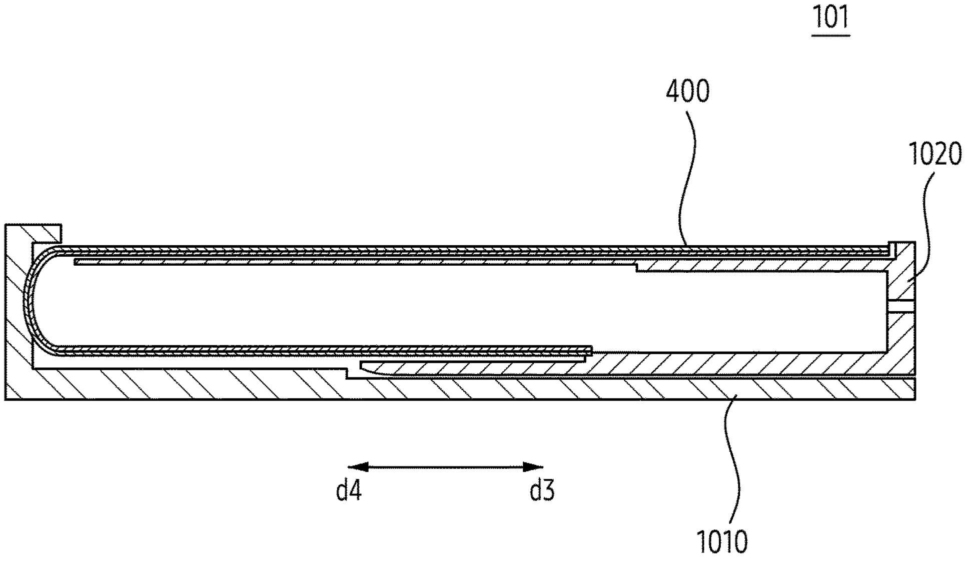
FIG. 10B is a cross-sectional view illustrating an example in which an electronic device is cut along line C-C' of FIG. 10A according to an embodiment of the disclosure.

FIG. 10A is a diagram illustrating an electronic device according to an embodiment of the disclosure, and FIG. 10B is a cross-sectional view illustrating an example in which an electronic device is cut along line C-C' of FIG. 10A according to an embodiment of the disclosure.

Referring to FIGS. 10A and 10B, according to an embodiment, an electronic device 101 may include a display 400, a first housing 1010, and/or a second housing 1020.

According to an embodiment, the first housing 1010 may accommodate at least a portion of the second housing 1020. The first housing 1010 may surround (or cover) at least a portion of the second housing 1020.

According to an embodiment, the second housing 1020 may be movable with respect to the first housing 1010. The second housing 1020 may be linearly movable with respect to the first housing 1010. The second housing 1020 may be slidable with respect to the first housing 1010. For example, the second housing 1020 may be movable along a third direction d3 and/or a fourth direction d4 opposite to the third direction d3 with respect to the first housing 1010. As the second housing 1020 moves along the third direction d3, the second housing 1020 may slide into the outside of the first housing 1010. As the second housing 1020 moves in the fourth direction d4, the second housing 1020 may slide into the inside of the first housing 1010. A state of the electronic device 101 may be changed by the movement of the second housing 1020 with respect to the first housing 1010. The state of the electronic device 101 may include a slide-in state and/or a slide-out state. In the slide-in state of the electronic device 101, the second housing 1020 may be movable in the third direction d3 of the third direction d3 and the fourth direction d4 with respect to the first housing 1010. For example, in the slide-in state of the electronic device 101, the second housing 1020 may be movable only in the third direction d3. In the slide-out state of the electronic device 101, the second housing 1020 may be movable in the fourth direction d4 of the third direction d3 and the fourth direction d4 with respect to the first housing 1010. For example, in the slide-out state of the electronic device 101, the second housing 1020 may be movable only in the fourth direction d4.

According to an embodiment, the display 400 may be disposed on the second housing 1020. The display 400 may be movable with respect to the first housing 1010 by the movement of the second housing 1020 with respect to the first housing 1010. For example, the display 400 may move from the inside of the first housing 1010 to the outside of the first housing 1010 by the movement of the second housing 1020 in the third direction d3. For example, in the slide-out state of the electronic device 101, a size of the electronic device 101 exposed to the outside of the first housing 1010 may be maximum. For example, the display 400 may move from the outside of the first housing 1010 to the inside of the first housing 1010 by the movement of the second housing 1020 in the fourth direction d4. For example, the display 400 may be rolled into from the outside of the first housing 1010 to the inside of the first housing 1010 by the movement of the second housing 1020 in the fourth direction d4.

Figure 11A:
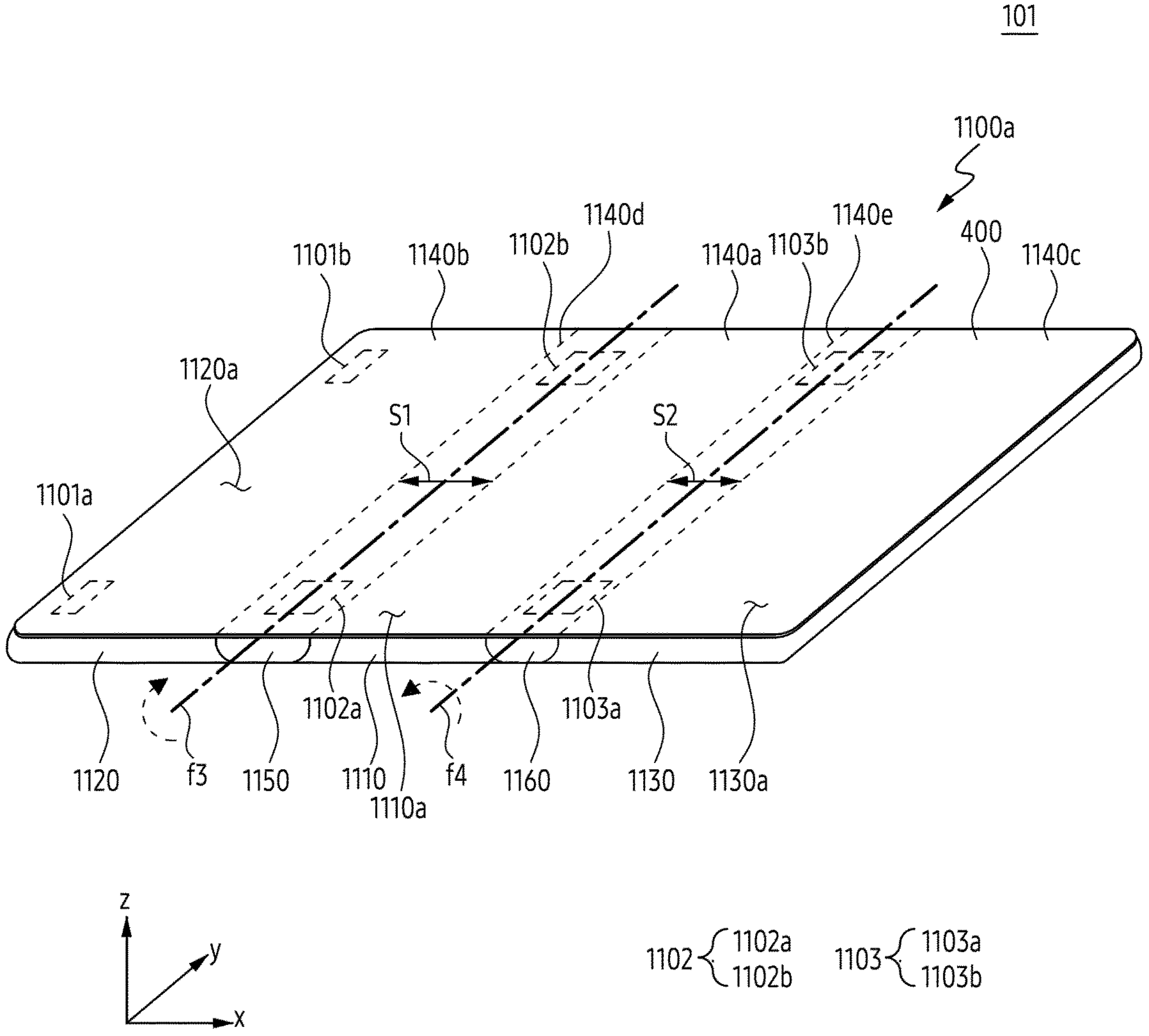
FIG. 11A illustrates an example of an unfolded state of an electronic device according to an embodiment of the disclosure.
Figure 11B:
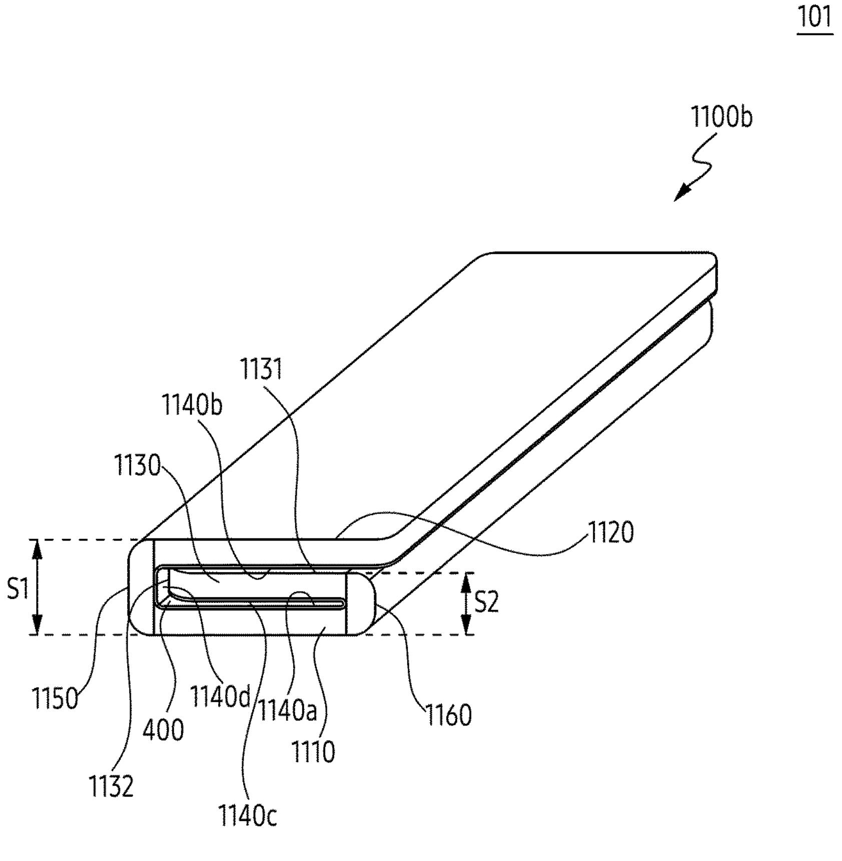
FIG. 11B illustrates an example of a fully folded state of an electronic device according to an embodiment of the disclosure.

FIG. 11A illustrates an example of an unfolded state of an electronic device according to an embodiment of the disclosure. FIG. 11B illustrates an example of a fully folded state of an electronic device according to an embodiment of the disclosure.

Referring to FIG. 11A, an electronic device 101 may be unfolded in a first state 1100*a*. The electronic device 101 may include a first housing 1110, a second housing 1120, and a third housing 1130. The first housing 1110 may include a first surface 1110*a*. The second housing 1120 may include a second surface 1120*a*. The third housing 1130 may include a third surface 1130*a*. The first state 1100*a* may be a state in which the first surface 1110*a*, the second surface 1120*a*, and the third surface 1130*a* face substantially the same first direction (e.g., a z-axis direction). The first state 1100*a*, which is a state that the first housing 1110, the second housing 1120, and the third housing 1130 are unfolded, may be referred to as the unfolded state. In the first state 1100*a*, the first housing 1110, the second housing 1120, and the third housing 1130 may substantially form a plane. For example, the first surface 1110*a*, the second surface 1120*a*, and the third surface 1130_a_ may form a plane as the first housing 1110, the second housing 1120, and the third housing 1130 substantially include a plane.

The electronic device 101 may include a first hinge structure 1102 (1102_a_ and 1102_b_) and a second hinge structure 1103 (1103_a_ and 1103_b_). The first hinge structure 1102 may include a plurality of first hinge structures 1102_a_ and 1102_b_. The second hinge structure 1103 may include a plurality of second hinge structures 1103_a_ and 1103_b_. The first hinge structures 1102_a_ and 1102_b_ may be disposed between the first housing 1110 and the second housing 1120. The first hinge structures 1102_a_ and 1102_b_ may rotatably connect the second housing 1120 with respect to the first housing 1110. For example, through the first hinge structures 1102_a_ and 1102_b_, the second housing 1120 may rotate with respect to the first housing 1110 based on a first folding axis f3. Through the rotation of the second housing 1120, a first angle Θ1 between the first housing 1110 and the second housing 1120 may be approximately 0 degrees to 180 degrees. The second hinge structures 1103_a_ and 1103_b_ may be disposed between the first housing 1110 and the third housing 1130. The second hinge structures 1103_a_ and 1103_b_ may rotatably connect the third housing 1130 with respect to the first housing 1110. For example, through the second hinge structures 1103_a_ and 1103_b_, the third housing 1130 may rotate with respect to the first housing 1110 based on a second folding axis f4. Through the rotation of the third housing 1130, the first angle Θ1 between the first housing 1110 and the third housing 1130 may be approximately 0 degrees to 180 degrees.

The first hinge structures 1102_a_ and 1102_b_ may be surrounded by a first hinge cover 1150. One hinge structure (e.g., 1102_a_) of the first hinge structures 1102_a_ and 1102_b_ may be disposed in an end of the first hinge cover 1150, and another hinge structure (e.g., 1102_b_) may be disposed in another end of the first hinge cover 1150. The second hinge structures 1103_a_ and 1103_b_ may be surrounded by a second hinge cover 1160. One hinge structure (e.g., 1103_a_) of the second hinge structures 1103_a_ and 1103_b_ may be disposed in an end of the second hinge cover 1160, and another hinge structure (e.g., 1103_b_) may be disposed in another end of the second hinge cover 1160.

The electronic device 101 may further include a display 400. The display 400 may be disposed on a surface formed by the first housing 1110, the second housing 1120, and the third housing 1130. The display 400 may be disposed on the first surface 1110_a_, the second surface 1120_a_, and the third surface 1130_a_. The display 400 may include a first display region 1140_a_, a second display region 1140_b_, and a third display region 1140_c_. The first display region 1140_a_ may be disposed on the first surface 1110_a_ of the first housing 1110. The first display region 1140_a_ may be a region coupled to the first surface 1110_a_ and not deformed. The second display region 1140_b_ may be disposed on the second surface 1120_a_ of the second housing 1120. The second display region 1140_b_ may be a region coupled to the second surface 1120_a_ and not deformed. The third display region 1140_c_ may be disposed on the third surface 1130_a_ of the third housing 1130. The third display region 1140_c_ may be a region coupled to the third surface 1130_a_ and not deformed. The first display region 1140_a_, the second display region 1140_b_, and the third display region 1140_c_ may be referred to as a planar region in terms of substantially forming a plane.

The display 400 may further include a fourth display region 1140_d_ and a fifth display region 1140_e_. The fourth display region 1140_d_ may be disposed on the first hinge cover 1150. The fourth display region 1140_d_ may be coupled to the first hinge cover 1150 or the first hinge structures 1102_a_ and 1102_b_. For example, the fourth display region 1140_d_ may be supported by a hinge plate (not illustrated) included in the first hinge structures 1102_a_ and 1102_b_. The fourth display region 1140_d_ may be deformed as the second housing 1120 rotates centered on the first folding axis f3 with respect to the first housing 1110.

The fifth display region 1140_e_ may be disposed on the second hinge cover 1160. The fifth display region 1140_e_ may be coupled to the second hinge cover 1160 or the second hinge structures 1103_a_ and 1103_b_. For example, the fifth display region 1140_e_ may be supported by a hinge plate (not illustrated) included in the second hinge structures 1103_a_ and 1103_b_. The fifth display region 1140_e_ may be deformed as the third housing 1130 rotates centered on the second folding axis f4 with respect to the first housing 1110.

The fourth display region 1140_d_ may be wider than an area of the fifth display region 1140_e_. For example, a first distance s1, which is a width of the fourth display region 1140_d_, may be longer than a second distance s2, which is a width of the fifth display region 1140_e_. When the electronic device 101 is converted into a folded state, a curvature radius of the fourth display region 1140_d_ may be greater than a curvature radius of the fifth display region 1140_e_.

The electronic device 101 may further include first magnets 1101_a_ and 1101_b_. The first magnets 1101_a_ and 1101_b_ may be disposed in the second housing 1120. For example, the first magnets 1101_a_ and 1101_b_ may be disposed on a side surface of the second housing 1120. The first magnets 1101_a_ and 1101_b_ may be disposed closer to another side surface facing a side surface than the side surface of the second housing 1120 facing the first hinge cover 1150. When the display 400 is viewed from above, the first magnets 1101_a_ and 1101_b_ may at least partially overlap an inactive region disposed along a periphery of the second display region 1140_b_. The first magnets 1101_a_ and 1101_b_ may be disposed to face the second hinge structures 1103_a_ and 1103_b_ when the second housing 1120 rotates and folds along the first folding axis f3.

Referring to FIG. 11B, the electronic device 101 may be folded in a second state 1100_b_. The second state 1100_b_ may be a state in which at least one surface of the first surface 1110_a_, the second surface 1120_a_, and the third surface 1130_a_ faces toward different directions. The third display region 1140_c_ corresponding to the third surface 1130_a_ may face substantially the same direction as a direction (e.g., a −z-axis direction) toward which the second display region 1140_b_ corresponding to the second surface 1120_a_ faces. The third display region 1140_c_ may face a direction different from a direction toward which the first display region 1140_a_ corresponding to the first surface 1110_a_ faces. For example, the direction (e.g., the −z-axis direction) toward which the third display region 1140_c_ faces may be a direction opposite to a direction (e.g., a +z-axis direction) toward which the first display region 1140_a_ faces. The third display region 1140_c_ may face the first display region 1140_a_. The second state 1100_b_ may be referred to as the folded state in that the first housing 1110, the second housing 1120, and the third housing 1130 are in a folded state. In the second state 1100_b_, the first housing 1110, the second housing 1120, and the third housing 1130 may face each other. For example, in the second state 1100_b_, the first housing 1110, the third housing 1130, and the second housing 1120 may be stacked in the first direction (e.g., the z-axis direction).

While changing from the first state 1100_a_ to the second state 1100_b_, the second housing 1120 may rotate based on the first folding axis f3 with respect to the first housing 1110 through the first hinge structure 1102. In the second state 1100*b*, the second housing 1120 may face the third housing 1130. For example, in the second state 1100*b*, the second display region 1140*b* disposed in the second housing 1120 may face a rear surface 1131 of the third housing 1130.

Through the second hinge structure 1103, the third housing 1130 may rotate with respect to the first housing 1110 based on the second folding axis f4. In the second state 1100*b*, the third housing 1130 may face the first housing 1110. For example, in the second state 1100*b*, the third display region 1140*c* disposed in the third housing 1130 may face the first display region 1140*a* disposed in the first housing 1110. A side surface 1132 of the third housing 1130 may face the fourth display region 1140*d*.

In the second state 1100*b*, an overlapping area between the display 400 and the first hinge structure 1102 when the first hinge cover 1150 is viewed from above may be wider than an overlapping area between the display 400 and the second hinge structure 1103 when the second hinge cover 1160 is viewed from above. The first distance s1, which is a width of the first hinge cover 1150 corresponding to the fourth display region 1140*d*, may be longer than a second distance s2, which is a width of the second hinge cover 1160 corresponding to the fifth display region 1140*e* (e.g., the fifth display region 1140*e* of FIG. 11A). A difference between the first distance s1 and the second distance s2 may correspond to a thickness of the second housing 1120.

Based on the difference between the first distance s1 and the second distance s2, it may be determined which of the second housing 1120 and the third housing 1130 is a housing foldable first. For example, the third housing 1130 may first rotate with respect to the first housing 1110 based on the second folding axis f4. The second housing 1120 may rotate with respect to the first housing 1110 based on the first folding axis f3 after the third housing 1130 is folded. As a width of the second hinge structure 1103 is narrower than a width of the first hinge structure 1102, the third housing 1130 may be folded to face the first housing 1110. For example, as the width of the first hinge cover 1150 is wider than the width of the second hinge cover 1160, the third housing 1130 may be folded to face the first housing 1110 based on an operation of the second hinge structure 1103 in the second hinge cover 1160. As the width of the first hinge structure 1102 is wider than the width of the second hinge structure 1103, the second housing 1120 may be folded to face the rear surface 1131 of the third housing 1130. For example, as the width of the first hinge cover 1150 is wider than the width of the second hinge cover 1160, the second housing 1130 may be folded to face the rear surface 1131 of the third housing 1130 based on an operation of the first hinge structure 1102 in the first hinge cover 1150.

According to the above-described embodiment, the electronic device 101 may provide the display 400 that may be folded at least once or more by including a plurality of hinge structures 1102 and 203. Through a width of the different hinge structures 1102 and 203, the display 400 may be folded several times.

In the electronic device, a screen displayed by a display may be visible not only when the screen is viewed frontally, but also when viewed from an angle different from an angle at which the screen is viewed frontally. In a case that the screen is visible from the different angle, another person other than a user of the electronic device may view the screen of the electronic device. The electronic device may need a structure for protecting a privacy of the user of the electronic device.

The technical problems to be achieved in this document are not limited to those described above, and other technical problems not mentioned herein will be clearly understood by those having ordinary knowledge in the art to which the disclosure belongs, from the following description.

The effects that may be obtained from the disclosure are not limited to those described above, and any other effects not mentioned herein will be clearly understood by those having ordinary knowledge in the art to which the disclosure belongs from the following description.

A display (e.g., the display 400 of FIG. 4A) is provided. The display may include a light-emitting layer (e.g., the light-emitting layer 430 of FIG. 4A). The light-emitting layer may include a first light-emitting region (e.g., the first light-emitting region 431 of FIG. 3) and a second light-emitting region (e.g., the second light-emitting region 432 of FIG. 3) adjacent to the first light-emitting region, and the first light-emitting region may have a size equal to a size of the second light-emitting region. The display may include an encapsulation layer (e.g., the encapsulation layer 470 of FIG. 4A). The encapsulation layer may be disposed on the light-emitting layer. The display may include a filter layer (e.g., the filter layer 620 of FIG. 6A). The filter layer may be disposed over the encapsulation layer. The display may further include an opaque member (e.g., the opaque member 440 of FIG. 6A). The opaque member may be disposed over the filter layer, the opaque member may partially overlap the first light-emitting region when viewed from a front of the display, such that light emitted from the first light-emitting region is limited to a range of a first viewing angle, and the opaque member may not overlap the second light-emitting region when viewed from the front of the display, such that light emitted from the second light-emitting region is limited to a range of a second viewing angle wider than the first viewing angle.

A display (e.g., the display 400 of FIG. 3) is provided. According to an embodiment, the display may include a first portion (e.g., the first portion 401 of FIG. 3) including a first sub-pixel (e.g., the first sub-pixel 411*a* of FIG. 3) having a first viewing angle. According to an embodiment, the display may include a second portion (e.g., the second portion 402 of FIG. 3) including a second sub-pixel (e.g., the second sub-pixel 421*a* of FIG. 3) having a second viewing angle wider than the first viewing angle. According to an embodiment, the display may include a plurality of first partition walls (e.g., the plurality of first partition walls 433 of FIG. 4A), which are spaced apart from each other and define the first sub-pixel, in the first portion. According to an embodiment, the display may include a first light-emitting region (e.g., the first light-emitting region 431 of FIG. 4A) disposed between the plurality of first partition walls. According to an embodiment, the display may include a plurality of second partition walls (e.g., the plurality of second partition walls 434 of FIG. 4B), which are spaced apart from each other and define the second sub-pixel, in the second portion. According to an embodiment, the display may include a second light-emitting region (e.g., the second light-emitting region 432 of FIG. 4A) having a size equal to a size of the first light-emitting region and disposed between the plurality of second partition walls. According to an embodiment, the display may include a plurality of first opaque members (e.g., the plurality of first opaque members 440 of FIG. 4A), which are disposed on the plurality of first partition walls and spaced apart from each other, in the first portion. According to an embodiment, a portion of each of the plurality of first opaque members may overlap a portion of the first light-emitting region such that the first viewing angle is narrower than the second viewing angle as each of the plurality of first opaque members has a width wider than a width of each of the plurality of first partition walls.

The display according to an embodiment may provide a structure in which the first viewing angle of the first sub-pixel is smaller than the second viewing angle of the second sub-pixel by the plurality of first opaque members covering the first light-emitting region.

According to an embodiment, the plurality of first opaque members may be disposed in the first portion of the first portion and the second portion.

The display according to an embodiment may provide a structure in which the first viewing angle of the first sub-pixel is smaller than the second viewing angle of the second sub-pixel by the plurality of first opaque members covering the first light-emitting region in the first portion.

According to an embodiment, the plurality of first opaque members may be disposed on the plurality of second partition walls to overlap the portion of the first light-emitting region in the first portion, and to be located outside the second light-emitting region, when the display is viewed from above, in the second portion.

Since a width of each of the plurality of first opaque members in the first portion is greater than a width of each of the plurality of first opaque members in the second portion, the display according to an embodiment may provide a structure in which the first viewing angle of the first sub-pixel is smaller than the second viewing angle of the second sub-pixel.

According to an embodiment, a distance between the plurality of first opaque members may be narrower than a width of the first light-emitting region.

In the display according to an embodiment, since the first light-emitting region is covered by the portion of each of the plurality of first opaque members, the distance between the plurality of first opaque members may be narrower than the width of the first light-emitting region.

According to an embodiment, the first light-emitting region and the second light-emitting region may include a first electrode (e.g., the first electrode 435 of FIGS. 4A and 4B). According to an embodiment, the first light-emitting region and the second light-emitting region may include an organic layer (e.g., the organic layer 432*c* of FIG. 4B) disposed on the first electrode, extending along the plurality of first partition walls, and the plurality of second partition walls, and including an organic light-emitting material. According to an embodiment, the first light-emitting region and the second light-emitting region may include a second electrode (e.g., the second electrode 436 of FIGS. 4A and 4B) disposed on the organic layer.

According to an embodiment, the portion of each of the plurality of first opaque members may overlap a portion of the first electrode.

In the display according to an embodiment, since the first light-emitting region is covered by the portion of each of the plurality of first opaque members, the distance between the plurality of first opaque members may be narrower than the width of the first light-emitting region.

According to an embodiment, the display may include a substrate (e.g., the substrate 450 of FIGS. 4A and 4B) supporting the plurality of first partition walls, the first light-emitting region, the plurality of second partition walls, and the second light-emitting region. According to an embodiment, the first light-emitting region and the second light-emitting region may be disposed on a surface of the substrate. According to an embodiment, a difference between a luminance of light emitted from the first light-emitting region to the outside of the display along a first direction toward which the surface of the substrate faces and a luminance of light emitted from the first light-emitting region to the outside of the display along a second direction inclined with respect to the first direction may be greater than a difference between a luminance of light emitted from the second light-emitting region to the outside of the display along the first direction and a luminance of light emitted from the second light-emitting area to the outside of the display along the second direction.

Since the plurality of first opaque members cover the first light-emitting region, the display according to an embodiment may provide a structure in which a difference between a luminance along the first direction and a luminance along the second direction in the first sub-pixel is greater than a difference between a luminance along the first direction and a luminance along the second direction in the second sub-pixel.

According to an embodiment, an area of the portion of the first light-emitting region may be smaller than an area of a remaining portion of the first light-emitting region.

Since the area of the portion of the first light-emitting region covered by the plurality of first opaque members is smaller than the area of the remaining portion of the first light-emitting region, the display according to an embodiment may provide a structure capable of suppressing excessive decrease in a luminance of the first sub-pixel.

According to an embodiment, when the display is viewed from above, a shape of each of the first sub-pixel and the second sub-pixel may be circular.

According to an embodiment, the display may include a light-emitting layer (e.g., the light-emitting layer 430 of FIGS. 4A and 4B) including the plurality of first partition walls, the first light-emitting region, the plurality of second partition walls, and the second light-emitting region. According to an embodiment, the display may include a substrate (e.g., the substrate 450 of FIGS. 4A and 4B) disposed below the light-emitting layer. According to an embodiment, the display may include an encapsulation layer (e.g., the encapsulation layer 470 of FIGS. 4A and 4B) disposed over the light-emitting layer. According to an embodiment, the plurality of first opaque members may be disposed over the encapsulation layer.

The display according to an embodiment may provide a structure capable of decreasing damage of the first light-emitting region and the second light-emitting region by the encapsulation layer.

According to an embodiment, the display may include a plurality of filters (e.g., the plurality of filters 621 of FIGS. 6A and 6B) disposed on each of the first light-emitting region and the second light-emitting region, and a plurality of second opaque members (e.g., the plurality of second opaque members 622 of FIGS. 6A and 6B) disposed on each of the plurality of first partition walls and the plurality of second partition walls, and include a filter layer (e.g., the filter layer 620 of FIGS. 6A and 6B) disposed between the encapsulation layer and the plurality of first opaque members.

According to an embodiment, the display may include a touch layer (e.g., the touch layer 610 of FIGS. 6A and 6B) disposed between the filter layer and the plurality of first opaque members, and including a touch electrode for receiving an input from the outside of the display.

According to an embodiment, the display may include the touch layer (e.g., the touch layer 610 of FIGS. 6A and 6B) disposed between the encapsulation layer and the filter layer, and including the touch electrode for receiving the input from the outside of the display.

According to an embodiment, the display may include a planarization layer disposed on the encapsulation layer. According to an embodiment, the plurality of first opaque members may be disposed on the planarization layer (e.g., the planarization layer 481 of FIGS. 4A and 4B).

According to an embodiment, when the display is viewed from above, the plurality of second opaque members may be located outside the first light-emitting region as a width of each of the plurality of second opaque members is equal to the width of each of the plurality of first partition walls.

An electronic device (e.g., the electronic device 101 of FIG. 3) is provided. According to an embodiment, the electronic device may include a display (e.g., the display 400 of FIG. 3). According to an embodiment, the electronic device may include display driving circuitry (e.g., the display driving circuitry 230 of FIG. 3) that is operatively coupled to the display. According to an embodiment, the display may include a first portion (e.g., the first portion 401 of FIG. 3) including a plurality of first sub-pixels (e.g., the plurality of first sub-pixels 411 of FIG. 3) having a first viewing angle. According to an embodiment, the display may include a second portion (e.g., the second portion 402 of FIG. 3) including a plurality of second sub-pixels (e.g., the plurality of second sub-pixels 421 of FIG. 3) having a second viewing angle wider than the first viewing angle. According to an embodiment, the display may include a plurality of first partition walls (e.g., the plurality of first partition walls 433 of FIG. 4A), which are spaced apart from each other and distinguish each of the plurality of first sub-pixels, in the first portion. According to an embodiment, the display may include a first light-emitting region (e.g., the first light-emitting region 431 of FIG. 4A) disposed between the plurality of first partition walls. According to an embodiment, the display may include a plurality of second partition walls (e.g., the plurality of second partition walls 434 of FIG. 4B), which are spaced apart from each other and distinguish each of the plurality of second sub-pixels, in the first portion. According to an embodiment, the display may include a second light-emitting region (e.g., the second light-emitting region 432 of FIG. 4A) disposed between the plurality of second partition walls. According to an embodiment, the display may include a plurality of first opaque members (e.g., the plurality of first opaque members 440 of FIG. 4A), which are disposed on the plurality of first partition walls and spaced apart from each other, in the first portion. According to an embodiment, a portion of each of the plurality of first opaque members may overlap a portion of the first light-emitting region such that the first viewing angle is narrower than the second viewing angle as each of the plurality of first opaque members has a width wider than a width of each of the plurality of first partition walls. According to an embodiment, the display driving circuitry may be configured to display a screen on the display based on activating the plurality of first sub-pixels and the plurality of second sub-pixels in a first state, and display the screen on the display based on deactivating at least a portion of the plurality of second sub-pixels and activating the plurality of first sub-pixels in a second state different from the first state.

According to an embodiment, the plurality of first opaque members may be disposed in the first portion from among the first portion and the second portion.

The display according to an embodiment may provide a structure in which the first viewing angle of the first sub-pixel is smaller than the second viewing angle of the second sub-pixel by the plurality of first opaque members covering the first light-emitting region in the first portion.

According to an embodiment, the plurality of first opaque members may be disposed on the plurality of second partition walls to overlap the portion of the first light-emitting region in the first portion, and to be located outside the second light-emitting region, when the display is viewed from above, in the second portion.

Since a width of each of the plurality of first opaque members in the first portion is greater than a width of each of the plurality of first opaque members in the second portion, the display according to an embodiment may provide a structure in which the first viewing angle of the first sub-pixel is smaller than the second viewing angle of the second sub-pixel.

According to an embodiment, an area of the portion of the first light-emitting region may be smaller than an area of a remaining portion of the first light-emitting region.

Since the area of the portion of the first light-emitting region covered by the plurality of first opaque members is smaller than the area of the remaining portion of the first light-emitting region, the display according to an embodiment may provide a structure capable of suppressing excessive decrease in a luminance of the first sub-pixel.

According to an embodiment, the display may include a light-emitting layer (e.g., the light-emitting layer 430 of FIGS. 4A and 4B) including the plurality of first partition walls, the first light-emitting region, the plurality of second partition walls, and the second light-emitting region. According to an embodiment, the display may include a substrate (e.g., the substrate 450 of FIGS. 4A and 4B) disposed below the light-emitting layer. According to an embodiment, the display may include an encapsulation layer (e.g., the encapsulation layer 470 of FIGS. 4A and 4B) disposed over the light-emitting layer. According to an embodiment, the plurality of first opaque members may be disposed over the encapsulation layer.

The display according to an embodiment may provide a structure capable of decreasing damage of the first light-emitting region and the second light-emitting region by the encapsulation layer.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. As used herein, each of such phrases as "A or B," "at least one of A and B," "at least one of A or B," "A, B, or C," "at least one of A, B, and C," and "at least one of A, B, or C," may include any one of or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively," as "coupled with," or "connected with" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry." A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between a case in which data is semi-permanently stored in the storage medium and a case in which the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:

at least one processor including processing circuitry;

memory including one or more storage mediums storing instructions; and a display, the display including:

first light emission groups each including a first light emission region;

second light emission groups alternatively disposed with the first light emission groups, the second light emission groups each including a second light emission region;

first pixel definition portion surrounding the first light emission region;

second pixel definition portion surrounding the second light emission region;

first opaque portion disposed above the first pixel definition portions to define a first opening, the first opening allowing light from the first light emission region to be observable at a narrower viewing angle than a viewing angle at which light from the second light emission region is observed; and second opaque portion disposed between the first pixel definition portion and the first opaque portion to define a second opening, wherein the first opening and the second opening are substantially center-aligned with each other, wherein a first width of the first opening is substantially equal to or narrower than a second width of the second opening, and wherein the instructions, when executed by the at least one processor individually or collectively, cause the electronic device to:

based on a state of the electronic device being in a normal display mode, control the first light emission groups and the second light emission groups to display a screen; and based on a state of the electronic device being changed from the normal display mode to a privacy display mode, control the first light emission groups to narrow a viewing angle of the screen displayed via the display.

2. The electronic device of claim 1, wherein the display includes a filter layer including:

a first color filter portion disposed above the first light emission region;

a second color filter portion disposed above the second light emission region; and the second opaque portion disposed between the first color filter portion and the second color filter portion.

3. The electronic device of claim 1, wherein the first pixel definition portion and the second pixel definition portion are a black pixel definition layer (BPDL).

4. The electronic device of claim 1, wherein the display does not include a polarization layer.

5. The electronic device of claim 1, wherein the display includes an encapsulation layer disposed between the first pixel definition portion and the second opaque portion.

6. The electronic device of claim 5, wherein the display includes a touch layer, disposed between the encapsulation layer and the second opaque portion, and including a touch electrode for receiving an input from outside of the display.

7. The electronic device of claim 1, wherein each of the first light emission region and the second light emission region has a circular shape.

8. The electronic device of claim 1, wherein at least one of the first pixel definition portion or the first opaque portion has a circular shape.

9. The electronic device of claim 1, wherein at least one of the first light emission groups or the second light emission groups includes one red light emission region, two green light emission regions, and one blue light emission region.

10. The electronic device of claim 1, comprising:

a display driving circuit operatively connected to the display, wherein the display driving circuit is configured to:

in the normal display mode, display a first screen corresponding to the normal mode by activating the first light emission region and the second light emission region, and in the privacy display mode, display a second screen corresponding to the privacy mode by deactivating the second light emission region and activating the first light emission region.

11. The electronic device of claim 1, wherein the first light emission region is configured to emit light of a first color, and wherein the second light emission region is configured to emit light of the first color wherein a size of the first light emission region is substantially the same as a size of the second light emission region.

12. The electronic device of claim 11, wherein, in a plan view, a size of a first electrode of the first light emission region is substantially the same as a size of a second electrode of the second light emission region, and wherein the first electrode has the same polarity as the second electrode.

13. The electronic device of claim 12, wherein the first electrode is an anode, and the second electrode is an anode.

14. The electronic device of claim 12, wherein, in a plan view, a size of the first light emission region corresponds to the size of the first electrode, and wherein, in a plan view, a size of the second light emission region corresponds to the size of the second electrode.

* * * * *